United States Patent [19]

Swenson

[11] Patent Number: 5,502,441
[45] Date of Patent: Mar. 26, 1996

[54] ANALOG SWITCHED-CAPACITOR VECTOR QUANTIZER

[75] Inventor: Jody A. Swenson, Logan, Utah

[73] Assignee: Utah State University Foundation, North Logan, Utah

[21] Appl. No.: 157,977

[22] Filed: Nov. 24, 1993

[51] Int. Cl.⁶ .................................................. H03M 1/12
[52] U.S. Cl. .................................................... 341/172
[58] Field of Search .................................. 341/172, 155, 341/158, 159, 161, 200

[56] References Cited

U.S. PATENT DOCUMENTS 4,926,180  5/1990  Anastassiou ........................... 341/159

OTHER PUBLICATIONS

W. Fang, et al., "A VLSI Neural Processor for Image Data Compression Using Self-Organization Networks" IEEE Trans. on Neural Networks, pp. 506–518, vol. 3, No. 3 (May 1992).
G. T. Tuttle, et al., "A Low-Power Analog CMOS Vector Quantizer," Proc. IEEE Data Compression Conf., Snowbird Utah, pp. 410–419 (Apr. 1993).
J. T. Wu et al., "A 100-Mhz Pipelined CMOS Comparator," IEEE Journal of Solid-State Circuits, vol. 23, No. 6, pp. 1379–1385 (Dec. 1988).
A. Yukawa, "A CMOS 8-bit High-Speed A/D Converter IC," IEEE Journal of Solid-State Circuits, vol. SC-20, No. 3, pp. 775–779 (Jun. 1985).
R. Gregorian et al., "Switched-Capacitor Circuit Design," Proceedings of the IEEE, vol. 71, No. 8, pp. 941–963 (Aug. 1983).
T. C. Choi et al., "High-Frequency CMOS Switched-Capacitor Filters for Communications Application," IEEE J. of Solid-State Circuits, vol. SC-18, No. 6, pp. 652–664 (Dec. 1983).

Primary Examiner—Brian K. Young
Attorney, Agent, or Firm—Trask, Britt & Rossa

[57] ABSTRACT

A switched-capacitor implementation of an analog vector quantizer (AVQ) determines which of various codevectors Vcb most closely matches a vector input signal Vinput of input signal samples. Applications for the AVQ include data compression and pattern recognition. The AVQ includes a plurality of distortion measuring circuits (DMCs) each receiving the input signal and a respective one of the codevectors. Each DMC provides a respective one of signals V0–Vn, which are measures of the distortion between Vinput and the respective codevector, where n is the number of codevectors. The signals V0–Vn are received by a best match and addressing generating (BMAG) circuit that determines which of the signals V0–Vn represents the lowest distortion. The BMAG circuit generates an identification signal that identifies which codevector corresponds to the signal representing the lowest distortion. The DMCs compute the L1 norm.

22 Claims, 24 Drawing Sheets

ANALOG SWITCHED-CAPACITOR VECTOR QUANTIZER

BACKGROUND OF THE INVENTION

1. Field

The present invention relates to a device that uses vector quantization for data compression or pattern recognition and, more particularly, to a device that uses an analog switched-capacitor approach to vector quantization.

2. State of the Art

Processing, storage, and transmission of information in digital form have become widespread. The conversion of an analog information source to a digital code introduces distortion because of amplitude quantization. The most common form of amplitude quantization used today is scalar quantization. Scalar quantization is often synonymous with analog-to-digital conversion (ADC). In scalar quantization each sample of the information source is considered independently, meaning that any dependencies between samples are disregarded. In contrast, vector quantization (VQ) deals with a block or vector of samples at once, and as a result has some performance advantages as compared with scalar quantization.

VQ refers to a family of digital coding techniques that have mainly been used for data compression. VQ can be viewed as pattern matching, where input patterns or vectors are approximated by one of many stored patterns in a codebook. The resulting quantization error from such an approximation clearly depends upon how well the stored patterns, referred to as codevectors, represent the input vectors. Consequently, codebook generation requires prior knowledge of the information source and is important to the performance of VQ.

An $\log_2 N$ bit scalar quantizer has N possible quantization levels, each represented by $\log_2 N$ bits. A scalar quantization of a vector of dimension k results in $N^k$ possible quantization vectors, each represented by $k\log_2 N$ bits. In VQ, the number of codevectors is typically much smaller than the $N^k$ possible quantization vectors because many of these vectors are not necessary for a particular input source. As a result the number of bits needed to represent the set of codevectors is typically much less than $k\log_2 N$, resulting in increased data compression.

Codebook generation for VQ is currently an active research area with several different algorithms in existence. In VQ, the source statistics are usually incorporated into the codebook generation process via a set of training vectors. The building of the codebook is based on this training set, which is to be representative of a particular information source. Codebook generation is often very time consuming, and is typically done off line prior to encoding.

One of the most commonly used techniques to generate codebooks for VQ is referred to as the LBG algorithm. This is an iterative partitioning algorithm based on the minimization of a distortion measure, and requires an initial codebook for starting. Partitioning of the training set is accomplished by associating each training vector with the corresponding closest codevector from the current codebook. New codevectors are computed as the centroids of the new partitions, or clusters, of training vectors. Iteratively updating codebooks in this fashion is continued until the improvement in the total distortion between the codevectors and the training vectors becomes negligible. This algorithm guarantees locally Optimal codebooks for VQ.

When referring to vector quantizers, a nearest neighbor vector quantizer is almost always assumed, although other possibilities exist. In a nearest neighbor vector quantizer the input vector is replaced by the codevector located nearest to the input vector in the vector space, as determined by some distortion measure. Consequently a nearest neighbor vector quantizer finds the codevector nearest to the input vector in the vector space, and then outputs the digital code of this nearest codevector. A commonly used distortion measure is the squared error distortion shown in equation (1), below:

$$d(\overline{V}\text{input}, \overline{V}cb) = \sum_{i=1}^{k} (V\text{input}_i - Vcb_i)^2, \qquad (1)$$

where $\overline{V}$input and $\overline{V}$cb are vectors of dimension k. In this background section and in the invention disclosure, a nearest neighbor vector quantizer is assumed when referring to a vector quantizer.

One drawback of VQ is that a very large number of codevectors are required to adequately represent many sources. In fact, codebook size and search complexity become unreasonably large for many applications in which the input source is encoded directly using one large codebook that is exhaustively searched. As a result, several techniques have been developed to reduce the hardware and computational complexity of direct full-search VQ. Two of the more common techniques are mean-removed VQ and tree-search VQ.

Mean-removed VQ (MRVQ) is a special case of product codes. Product codes refer to a family of vector quantization methods in which one large codebook is replaced by more than one smaller codebook. As a result, the vector space represented by the overall quantizer is given as the Cartesian product of smaller vector spaces, and hence the name product codes. In MRVQ, the sample mean of each input vector is computed and then subtracted from every vector component. The resulting mean removed, or residual, vector is then vector quantized. The utility of MRVQ is that the residual vectors can be adequately represented with many fewer codevectors as compared to the original image vectors. The mean of each vector is also coded and included along with each codevector index. Thus, a mean codebook and a residual codebook are used in MRVQ. Since the mean is a scalar quantity, it is scalar quantized. As a result, the mean codebook includes all of the possible quantization levels of the scalar quantizer. MRVQ can provide a significant reduction in the overall complexity of a VQ system as compared to direct VQ.

Tree-search VQ is a commonly used technique to reduce the codebook search complexity of vector quantization. Tree-search VQ relies on a tree-structured codebook including nodes and levels. Each node contains a small codebook, and the best codevector at each node determines the search path to the next lower level. Searching begins at the top node, or root, codebook of the tree and continues downward to the lowest level. The tree structure eliminates the need to search the entire codebook and results in a significant reduction in encoding complexity. The price for this reduced complexity is slightly higher distortion as compared to full-search VQ. Full-search codebook generation algorithms are altered to yield tree-structured codebooks.

A challenge in hardware implementations of vector quantizers is the large complexity required for searching codebooks. Codebooks with over $2^{16}$ codevectors are not uncommon for image compression applications. Nonetheless, vector quantization hardware has been developed for both speech and image coding. Almost all of the emphasis on VQ hardware to date has been on digital implementations.

The articles W. C. Fang, et al., "A VLSI Neural Processor for Image Data Compression Using Self-Organization Networks," *IEEE Trans. on Neural Networks,* pp. 506–18, Vol. 3, No. 3, May 1992; and G. T. Tuttle, et al., "A Low-Power Analog CMOS Vector Quantizer," *Proc. IEEE Data Compression Conf.,* Snowbird Utah, pp. 410–419, April 1993, are the only published reports of analog VQ hardware implementations known to the inventor, and these hardware implementations suffer from relatively poor accuracy. The systems of both articles rely on an Euclidean distance (L2 norm) as a distortion measure. This measure requires a squaring operation that is accomplished in the systems of both articles by utilizing the square law characteristics of a metal-oxide-semiconductor (MOS) transistor. A problem with this approach is the relatively poor accuracy due to limitations of matching MOS transistors because of processing variations and thermal gradients.

SUMMARY OF THE INVENTION

A switched-capacitor implementation of an analog vector quantizer (AVQ) determines which of various codevectors $\overline{V}cb$ most closely matches a vector input signal $\overline{V}input$ of input signal samples. Applications for the AVQ include data compression and pattern recognition.

The AVQ includes a plurality of circuits that measure distortion which receive the input signal and the codevectors. The circuits that measure distortion use capacitors in determining distortion. In one embodiment, each of the circuits that measure distortion compares the input signal with one of the codevectors to obtain a signal V, representative of the distortion between the input signal and the particular codevector. Each of the circuits that measure distortion provide the respective one of signals $V0$–$Vn$, where n is the number of codevectors. The signals $V0$–$Vn$ are received by a best match circuit which determines which of the signals $V0$–$Vn$ represents the lowest distortion. A circuit generates an identification signal (e.g., an address signal) that identifies which codevector corresponds to the signal representing the lowest distortion.

The AVQ may reside in an integrated circuit chip. A source of the codevectors may be on or off the integrated circuit chip in which the AVQ resides. Bonding pads may be employed to prevent large voltages from signals outside the chip from damaging circuitry in the AVQ.

A large number of codevectors may be involved by joining multiple AVQs through arbitrator logic circuitry including a best match circuit to determine which AVQ is associated with the lowest distortion. Well known tree structures may be employed.

The AVQ may be used in connection with mean-removed vector quantization (MRVQ).

DETAILED DESCRIPTION OF PREFERRED EMBODIMENTS

For the convenience of the reader, the following is a table of contents for the remainder of the specification:

A. Analog Vector Quantizer (AVQ)
 1. System Overview
 2. Distortion-Measuring Circuit (DMC)
  a. Absolute Difference Circuit
  b. Averaging circuit
  c. Sample-and-Hold
  d. Limitations of the DMCs
 3. Best Match and Address Generation Circuit
  a. BMAG4 Circuit
  b. BMAG Circuit
 4. Timing and Control Logic
  a. Timing Generator Circuit.
  b. BUF1 Circuit
  c. BUF2 Circuit
  d. Address Ready Circuit
  e. AVQ 10 Timing
 5. Layout of AVQ 10
 6. Size Estimates
B. Subblocks of AVQ 10
 1. COMP1 Circuit
 2. OPN5 Circuit
 3. PHGEN circuit
 4. Standard Cells
  a. Bonding Pads
  b. Digital Logic
C. Analog Memory
 1. Analog ROM
 2. Floating-Gate MOSFET
D. Measured Results of AVQ 10
 1. Background
 2. Accuracy of AVQ 10 Circuitry
 3. AVQ 10 Data Compression System
E. Analog VLSI Implementations
 1. Background
 2. Switched-Capacitor Circuit Limitations
  a. Capacitor Mismatch
  b. Switch-induced Error Voltages
F. AVQ Applications
 1. Data Compression
 2. Pattern Recognition
G. Variations A. Analog Vector Quantizer (AVQ)

The present invention is a switched-capacitor implementation of an analog vector quantizer (AVQ), which is more accurate than previously reported approaches. Analog vector quantization provides more efficient coding as compared to scalar analog-to-digital conversion. More specifically, the AVQ determines which of various codevectors $\overline{V}cb$ most closely matches a vector input signal $\overline{V}input$ of input signal samples. Applications for the AVQ include data compression and pattern recognition. $\overline{V}input$ could originate from a variety of sources and represent a variety of phenomenon including imaging and audio phenomenon.

1. System Overview

Figure 1:
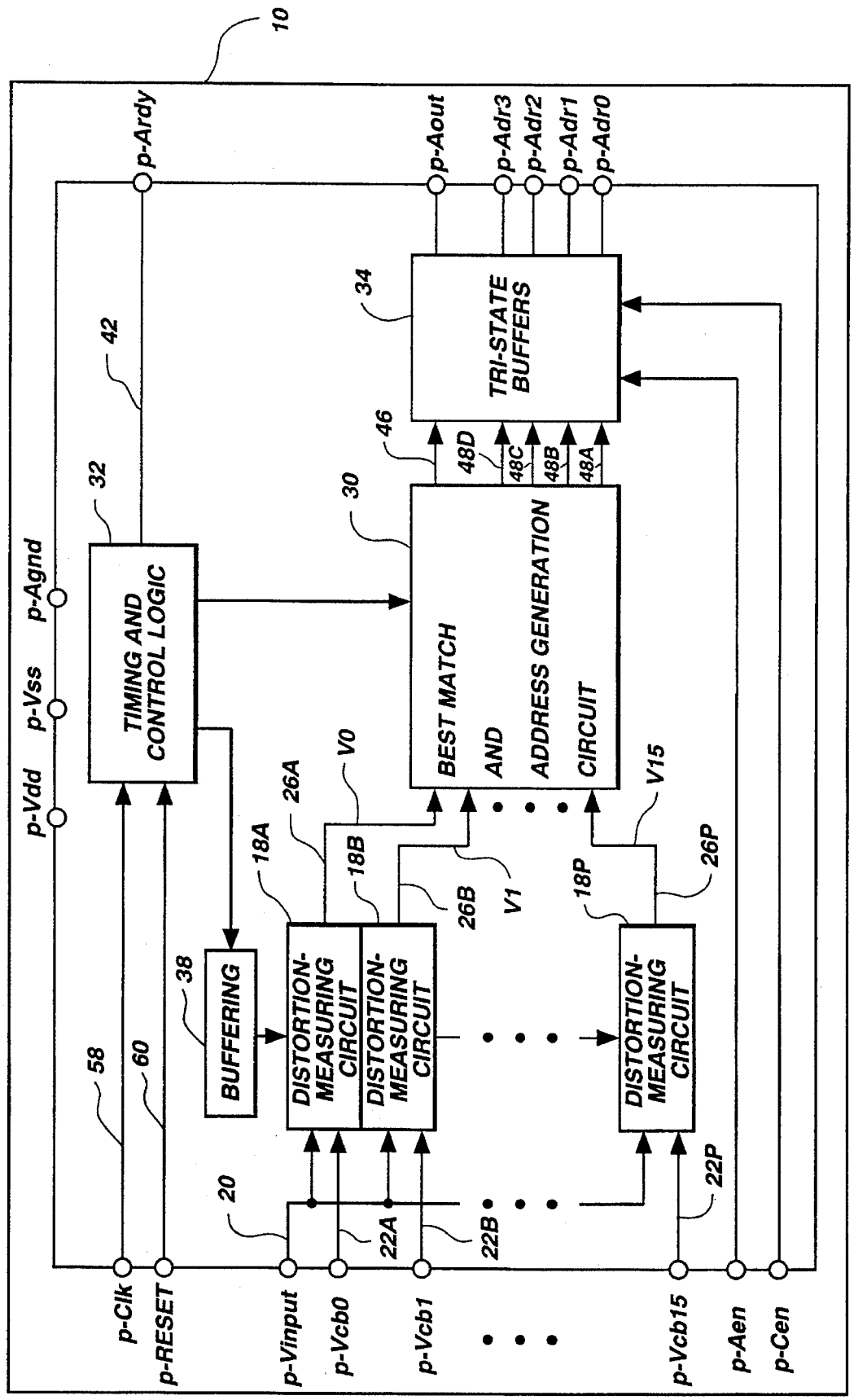
FIG. 1 is a block diagram of an analog vector quantizer (AVQ) according to the present invention capable of processing 16 codevectors at once.

FIG. 1 shows a block diagram of AVQ 10, which is implemented in VLSI and is a preferred embodiment of the AVQ of the present invention. AVQ 10 was implemented with the SCNA20 process of the MOSIS Service, USC/ Information Science Institute, Marina Del Rey, Calif.

AVQ 10 receives analog input vector $\overline{V}input$ at a pin p-Vinput. The term "pin" herein includes a connection point to the world outside the VLSI circuit or to another circuit within the VLSI circuit. AVQ 10 receives 16 analog codevectors $\overline{V}cb0$, $\overline{V}cb1$, $\overline{V}cb2$, ..., $\overline{V}cb15$ (collectively "codevectors $\overline{V}cb$") at pins p-Vcb0, p-Vcb1, p-Vcb2, ..., p-Vcb15, respectively. Of course, an AVQ could be designed to receive more or less than 16 codevectors.

AVQ 10 includes distortion measuring circuits ("DMCs") 18A, 18B, ..., 18P (collectively "DMCs 18"). Pin p-Vinput is connected to each of DMCs 18 through conductor 20. Pin p-Vcb0 is connected to DMC 18A through conductor 22A, pin p-Vcb1 is connected to DMC 18B through conductor 22B, and so forth such that pin p-Vcb15 is connected to DMC 18P through conductor 22P. Consequently, DMC 18A receives codevector $\overline{V}cb0$, DMC 18B receives codevector $\overline{V}cb1$, DMC 18C receives codevector $\overline{V}cb2$, and so forth such that DMC 18P receives codevector $\overline{V}cb15$.

DMC 18A, 18B, ..., 18P provide the V0, V1, ..., V15 signals to conductors 26A, 26B, ..., 26P, respectively, (collectively "conductors 26"). The V0–V15 signals, which are defined in equation (9)), below, are measures of the distortion between $\overline{V}input$ and respective ones of codevectors $\overline{V}cb$. For example, V0 is a measure of the distortion between $\overline{V}input$ and $\overline{V}cb0$. V1 is a measure of the distortion between $\overline{V}input$ and $\overline{V}cb1$. V15 is a measure of the distortion between $\overline{V}input$ and $\overline{V}cb15$. Conductors 26A–26P are connected to best match and address generation circuit (BMAG) 30, which determines which one of the V0–V15 signals has the lowest distortion.

In AVQ 10 described herein, each of the codevectors $\overline{V}cb$ is a 16 component analog vector. That is, each of the codevectors $\overline{V}cb$ has 16 components (components 0–15), which are provided to a respective one of pins p-Vcb0–p-Vcb15 serially. The input vector $\overline{V}input$ also has 16 components, which are provided to pin p-Vinput serially. Codevectors $\overline{V}cb$ and input vector $\overline{V}input$ do not necessarily have boundaries between the 16 components other than those created by the sample circuitry described below. (Of course, $\overline{V}cb$ and $\overline{V}input$ could each have a smaller or a larger number of components, depending on the application.)

Briefly stated, AVQ 10 operates as follows. The 16 components of each of $\overline{V}input$ and $\overline{V}cb0$–$\overline{V}cb15$ are input serially to the pins p-Vinput and p-Vcb0–p-Vcb15, respectively, upon successive clock cycles CC0–CC15. That is, during the first clock cycle (CC0), pins p-Vinput receives the first component of $\overline{V}input$, and pins p-Vcb0–p-Vcb15 receive the first components of codevectors $\overline{V}cb0$–$\overline{V}cb15$, respectively. During the second clock cycle (CC1), pins p-Vinput receives the second component of $\overline{V}input$, and pins p-Vcb0–p-Vcb15 receive the second components of codevectors $\overline{V}cb0$–$\overline{V}cb15$, respectively.

Each DMC 18 generates on one of conductors 26A–26P a respective one of the signals V0–V15, which are analog voltage that are proportional to the distortion between $\overline{V}input$ and each codevector $\overline{V}cb$. The 16 DMCs 18 compute distortions in parallel. Sample-and-holds in DMCs 18 sample the associated distortion voltages at the completion of each 16-component vector. These sample-and-holds provide the previously sampled distortion voltages to BMAG 30 while distortion computations on the next input vector $\overline{V}input$ are in progress.

BMAG 30 determines which V0–V15 voltage corresponds to the minimum distortion between $\overline{V}input$ and $\overline{V}cb0$–$\overline{V}cb15$, and then generates a 4-bit binary address of the associated codevector. Under the addressing scheme, address 0000 represents $\overline{V}cb0$, address 0001 represents $\overline{V}cb1$, and so forth such that address 1111 represents $\overline{V}cb15$. The analog output voltage corresponding to the minimum distortion is also output from BMAG 30, under the control of the analog output enable (Aen) input signal.

Timing and control logic 32 generates the timing and control signals used by the DMCs 18 (through buffering 38) and BMAG 30. Timing and control logic 32 also generates the address ready (Ardy) signal on conductor 42 to pin p-Ardy. The Ardy signal indicates to an external device when the address from BMAG 30 is valid. The Clk signal at input pin p-Clk is the timing reference signal for AVQ 10 and is received on conductor 58 by timing and control logic 32. The analog voltages of $\overline{V}$input and $\overline{V}$cb0–$\overline{V}$cb15 are to be setup when Clk is high and are then sampled when Clk goes low. The Reset signal at input pin p-Reset is received on conductor 60 by timing and control logic 32 and causes AVQ 10 to begin processing a new vector and allows synchronization of AVQ 10 with an external device. Timing and control logic 32 automatically cycles from one vector to the next, so asserting the Reset signal is only required once for initial synchronization.

The chip enable signal (Cen) asserted low and the Aen signal asserted low are input signals received at input pins p-Cen and p-Aen. The Cen and Aen signals control tri-state buffers 34, which provide the Adr0, Ard1, Ard2, Adr3, and Aout signals to output pins p-Adr0, p-Ard1, p-Ard2, p-Ard3, p-Aout, respectively. Tri-state buffering the digital Adr0–Adr3 signals allows multiple AVQ 10s to share a common data bus. Tri-state buffering the Aout output allows this output to be disabled when not used, and also during the time when AVQ 10 is computing the address of the best matching of the codevectors $\overline{V}$cb. When a codevector address is being computed, which occurs when Ardy is low, the Aout output is tri-stated to prevent it from affecting the BMAG 30 circuit.

AVQ 10 is designed for Vdd–Vss=5.0 V, as determined by the 2-μm CMOS process used, and Agnd=(Vdd– 1.5) V. The voltage range of the analog inputs is from (Vdd–2.0) V to (Vss+0.5) V, which is a 2.5 V full-scale range for Vdd–Vss= 5.0 V. AVQ 10 is designed to operate at sample frequencies ranging from 100 Hz to 1 MHz. Each of the main blocks of AVQ 10 is discussed in detail in the following sections.

For convenience, Table 1 lists names and descriptions of the pins of AVQ 10, shown in FIG. 1.

TABLE 1

| Pin Name | Pin Description |
| --- | --- |
| p-Vdd | Positive supply voltage |
| p-Vss | Negative supply voltage |
| p-Agnd | Analog ground |
| p-Vcb0-p-Vcb15 | Analog codevector inputs |
| p-Vinput | Analog input vector |
| p-Clk | Clock input |
| p-Reset | Reset to start of vector input |
| p-Aen | Analog output enable asserted low |
| p-Cen | Chip enable asserted low |
| p-AddrO-p-Addr3 | 4-bit best match address output |
| p-Aout | Best match analog voltage output |
| p-Ardy | Address ready output signal |

2. Distortion-Measuring Circuit (DMC)

DMCs 18 compute the distortion between the input vector $\overline{V}$input and each associated codevector $\overline{V}$cb. The distortion measure used for AVQ 10 is the L1 norm, shown in equation (2), below:

$$d(\overline{V}\text{input}, \overline{V}cb) = \sum_{i=1}^{k} |V\text{input}_i - Vcb_i|, \quad (2)$$

where $\overline{V}$input and $\overline{V}$cb are vectors of dimension k. The vector dimension k is fixed in hardware in AVQ 10, and was chosen as 16. (Alternatively, AVQ 10 could allow a different value of k or a programmable variable k.) The L1 distortion measure was chosen over the more common squared-error distortion given in equation (1) because it is more easily computed in hardware and has been found to perform nearly as well.

Each DMC 18 includes three subcircuits: an absolute difference circuit 36 (shown in FIG. 2), an averaging circuit 40 (shown in FIG. 3), and a sample-and-hold circuit 44 (shown in FIG. 4), each of which are discussed in the following sections.

a. Absolute Difference Circuit

Figure 2:
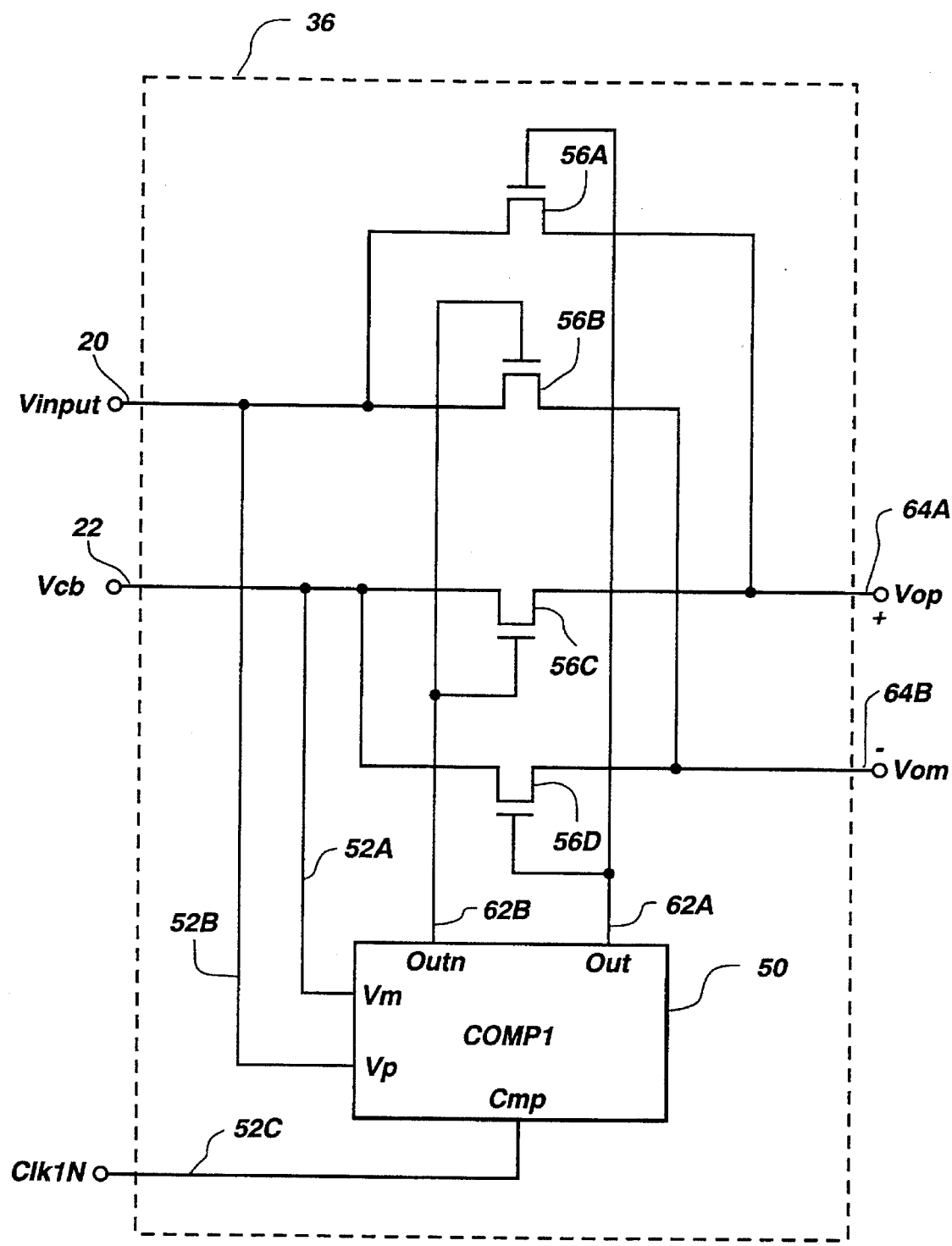
FIG. 2 is a schematic of an absolute difference circuit in one of the distortion measuring circuits of the AVQ of FIG. 1.

Referring to FIG. 2, absolute difference circuit 36 is contained in one of the 16 DMCs 18. Analogous absolute difference circuits are contained in each of the other 15 DMCs 18. The dashed lines in FIG. 2 are for conceptual and illustrative purposes in describing the circuit and do not represent physical objects in AVQ 10. Likewise, the blocks in FIG. 1 and other figures are also for conceptual and illustrative purposes.

Absolute difference circuit 36 computes the absolute difference between the respective components of $\overline{V}$input and $\overline{V}$cb, which is used for computation of the L1 norm in equation (2). Conductor 22, which carries components of $\overline{V}$cb, is one of the conductors 22A–22P. Absolute difference circuit 36 includes a voltage magnitude comparator COMP1 50, which receives signals Vm, Vp, and Clk1n on conductors 52A, 52B, and 52C, respectively. Absolute difference circuit 36 also includes switching transistors 56A, 56B, 56C, and 56D. COMP1 50 determines which of the respective components of $\overline{V}$input and $\overline{V}$cb is larger, and generates the corresponding digital outputs. COMP1 50 includes output signals Out and Outn on conductors 62A and 62B. If the plus input Vp is larger than the minus input Vm, then the digital output Out is a logic 1 value and Outn is a logic 0 value, and vice versa for the minus input larger than the plus input. The Clk1n input comes from a buffer 1 (BUF1) circuit 66 in timing and control logic 32, and controls COMP1 50. The voltage inputs to absolute difference circuit 36 are to be setup when Clk1n is low, and a comparison is initiated when Clk1n goes high. The details of COMP1 50 are discussed in section B.1, below.

In FIG. 2, the digital outputs Out and Outn from COMP1 50 control the n-channel MOS switching transistors such that the more positive input voltage to absolute difference circuit 36 is passed as signal Vop to output conductor 64A, and the more negative input voltage is passed as signal Vom to output conductor 64B. As a result, the absolute value of the voltage difference between components of the $\overline{V}$input and $\overline{V}$cb inputs is provided at the output conductors 64A and 64B. This absolute difference is input to averaging circuit 40, discussed next.

b. Averaging Circuit

Figure 3:
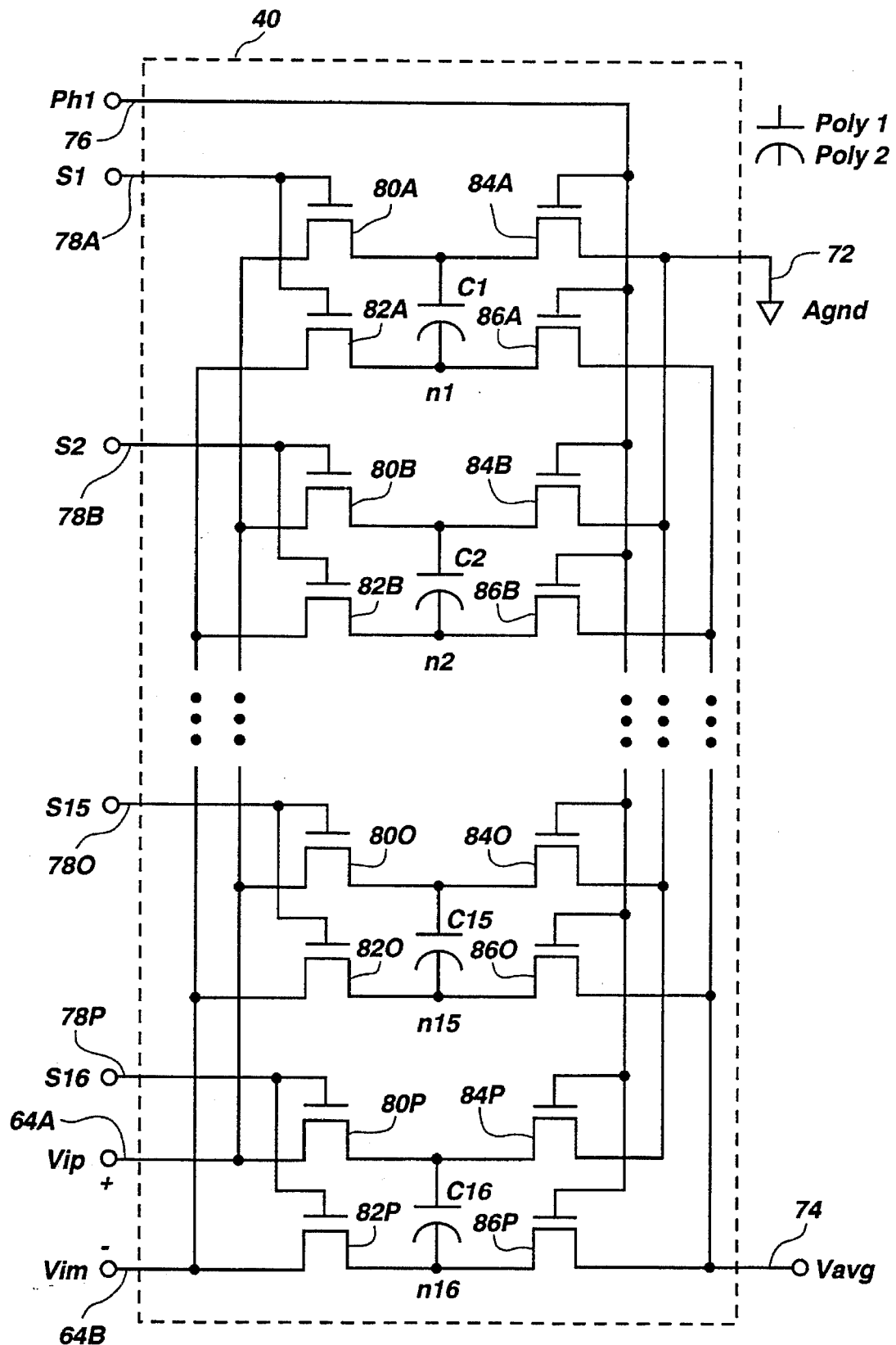
FIG. 3 is a schematic of an averaging circuit in one of the distortion measuring circuits of the AVQ of FIG. 1.

Referring to FIG. 3, an averaging circuit 40 implements the summation in equation (2) and operates as follows. Input conductors 64A and 64B and signals Vip and Vim correspond to output conductors 64A and 64B and signals Vop and Vom of absolute difference circuit 36. Signal Ph1 is received on conductor 76. Signals S1, S2, . . . , S16 are received on conductors 78A, 78B, . . . , 78P. Summing capacitors C1, C2, . . . , C16 are all identical and are charged up to the associated $Vip_i$ minus $Vim_i$ voltage (where i signifies components of $\overline{V}$input and $\overline{V}$cb). Capacitors C1–C16 are charged under the control of control signals S1, S2, . . . , S16 through transistors 80A, 80B, . . . , 80P, and 82A, 82B, . . . , 82P. When all 16 capacitors C1–C16 have been charged to the associated $Vip_i$ minus $Vim_i$ voltages, they are all switched in parallel between Agnd at ground 72 and the output voltage Vavg at an output 74 under the control signal Ph1 through transistors 84A, 84B, . . . , 84P, and 86A, 86B, . . . , 86P, which completes the averaging operation. Control signals S1–S16 and Ph1 are generated by BUF1 66 (shown in FIG. 9) in timing and control logic 32, discussed below. After averaging, the Vavg output with respect to analog ground is given in equation (3)), below:

$$Vavg = \left(\frac{1}{C_{Total}}\right) \sum_{i=1}^{16} C_i(Vip_i - Vim_i), \quad (3)$$

where $C_{Total}=C1+C2+\ldots+C16$. Since $C1=C2=\ldots=C16$, Ci is a constant and can be brought out in front of the summation which reduces to $Ci/C_{Total}=1/16$. Averaging circuit 40 takes the absolute value $|Vinput_i-Vcb_i|$ from absolute difference circuit 36 as an input. Replacing $(Vip_i-Vim_i)$ by $|Vinput_i-Vcb_i|$ provided by absolute difference circuit 36 results in a distortion measure given in equation (4), below:

$$Vavg = \left(\frac{1}{16}\right) \sum_{i=1}^{16} |Vinput_i - Vcb_i|, \quad (4)$$

where $Vinput_i$ and $Vcb_i$ are components of vectors $\overline{V}input$ and $\overline{V}cb$. Vavg at output 74 of averaging circuit 40 is proportional to the L1 norm and represents the average magnitude of the quantization error between $\overline{V}input$ and the associated $\overline{V}cb$. The output voltage Vavg from averaging circuit 40 is sampled and held by sample-and-hold circuit 44, discussed next.

c. Sample-and-Hold

Figure 4:
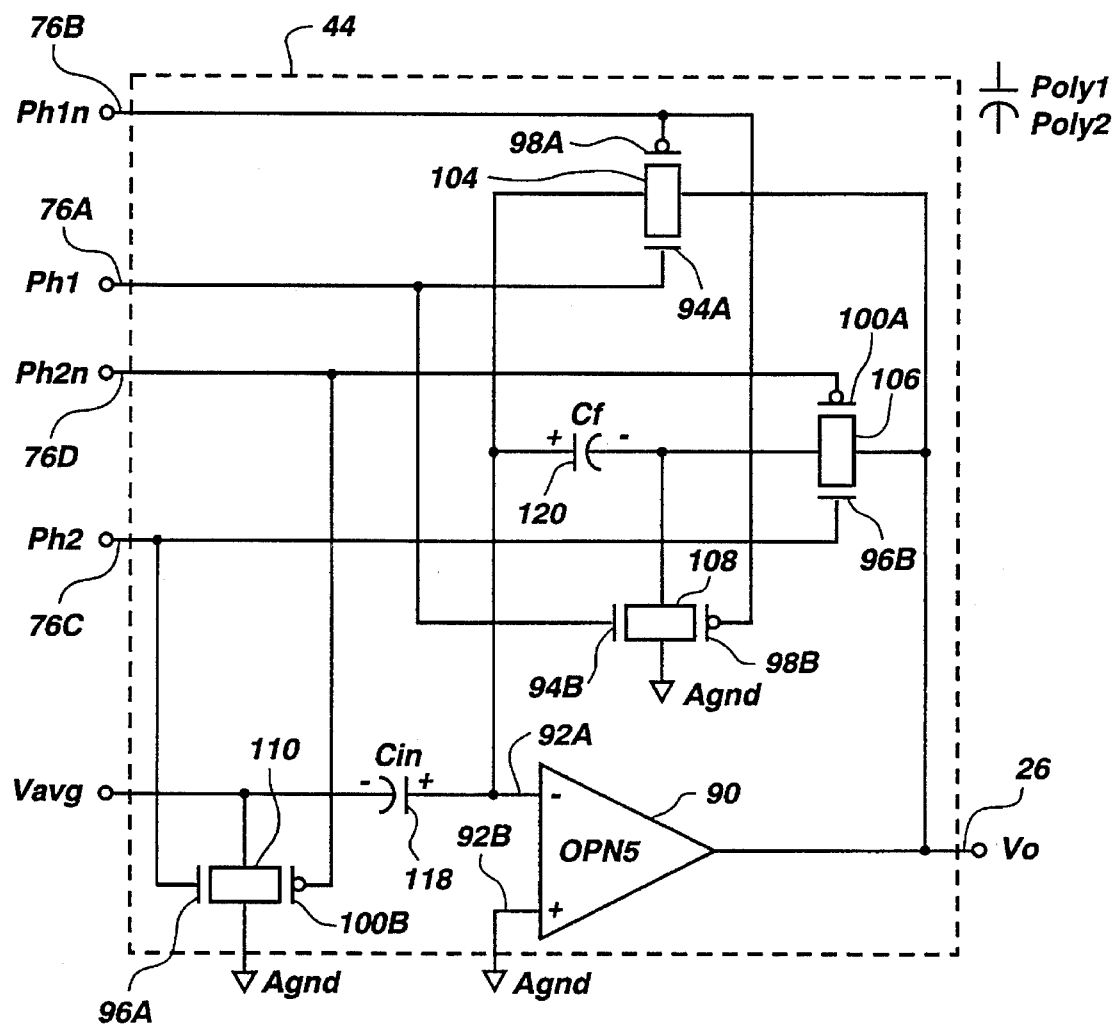
FIG. 4 is a schematic of a sample-and-hold circuit in one of the distortion measuring circuits of the AVQ of FIG. 1.

Referring to FIG. 4, sample-and-hold circuit 44 is a noninverting, offset compensated, sample-and-hold circuit known in the art. Sample-and-hold circuit 44 is in one of DMCs 18. Analogous sample-and-hold circuits are in the other 15 DMCs 18. Sample-and-hold circuit 44 uses an op-amp OPN5 90, discussed in section B.2, below. The minus input of OPN5 90 is connected to conductor 92A and the plus input of OPN5 90 is connected to ground Agnd through conductor 92B. The output of OPN5 90 is voltage Vo on conductor 26.

The signals Ph1, Ph1n, Ph2, and Ph2n on conductors 76A, 76B, 76C, and 76D are timing signals that are generated by a PHGEN circuit 114 (shown in FIGS. 9 and 17) in BUF1 66 (shown in FIG. 9) in timing and control logic 32. Ph1 and Ph2 are nonoverlapping signals of opposite phase, and Ph1n and Ph2n are the complements of Ph1 and Ph2, respectively. The signals Ph1 and Ph2 drive n-channel transistors 94A, 94B, 96A, and 96B, and signals Ph1n and Ph2n drive p-channel transistors 98A, 98B, 100A, and 100B of CMOS couplers 104, 106, 108, and 110. The nonoverlapping timing signals are used to guarantee that one coupler is turned off before the next coupler is turned on, which prevents charge leakage in sample-and-hold circuit 44.

If switch-induced errors are neglected, sample-and-hold circuit 44, shown in FIG. 4, works as follows. During clock phase Ph1, which is the sample phase, the input capacitor 118 having a capacitance Cin is charged up to Vavg±Vos where Vavg is the output voltage from averaging circuit 40, and Vos is the offset voltage of OPN5 90. By assuming that sufficient settling time has occurred at a given time t1 during the sampling time interval, and that Vavg(t1)<Agnd, the charge on capacitor 118 is given in equation (5) below:

$$Z_{Cin}(t1)=(Vavg(t1)\pm Vos)Cin \quad (5),$$

with the polarity shown in FIG. 4. A feedback capacitor 120 having a capacitance Cf is also charged to the offset voltage Vos of OPN5 90 during Ph1 with a resulting charge given in equation (6), below:

$$Z_{Cf}(t1)=\pm VosCf \quad (6).$$

During clock phase Ph2 the input side of the capacitor Cin is switched to analog ground, and capacitor 120 is connected between the output and the inverting input of OPN5 90. In this negative feedback configuration, OPN5 90 causes an amount of charge equal to Vavg(t1)Cin to be transferred to Cf. Assuming that sufficient settling time has occurred at a given time t2 during Ph2, the charge on capacitor Cf is provided in equation (7), below:

$$Q_{Cf}(t2)=Q_{Cf}(t1)+Vavg(t1)Cin \quad (7).$$

The output voltage from sample-and-hold circuit 44 at time t2 is provided in equation (8), below:

$$Vo(t2)=(\pm VosCf+Vavg(t1)Cin)/Cf\pm Vos \quad (8).$$

which simplifies to equation (9)), below:

$$Vo(t2)=(Cin/Cf)Vavg(t1) \quad (9).$$

Thus, the output of sample-and-hold circuit 44 is linearly related to the input voltage by a capacitor ratio, which can be accurately controlled as discussed in section E, below. A ratio of Cin/Cf=1 was chosen for sample-and-hold circuit 44 resulting in unity voltage gain.

Output voltage Vo on the particular output 26 of sample-and-hold circuit 44 is the output of DMC 18 and, therefore, is proportional to the L1 norm between the input vector and associated codebook vector. Output 26 is one of outputs 26A–26P, shown in FIG. 1, and carries one of the V0–V15 signals. Actually, output Vo of sample-and-hold circuit 44 is only equal to approximately (0.9) Vavg from averaging circuit 40 because of capacitive attenuation between the averaging output and the sample-and-hold input. This capacitive attenuation is not a problems however, because it is well matched among all of DMCs 18.

d. Limitations of DMCs 18

Conductors 26A–26P at the outputs of DMCs 18 carry signals V0–V15 and are electrically connected to BMAG 30, which determines the address associated with the codevector for which there is the minimum distortion. Consequently, only the matching between the separate DMCs 18 is important to the operation of AVQ 10.

One source of mismatch occurring between different DMCs 18 is the random offset voltage of COMP1 50 in absolute difference circuit 36. This offset voltage will cause absolute difference circuit 36 to make errors as to which voltage is larger when the differences between the respective components of $\overline{V}input$ and $\overline{V}cb$ are within the offset voltage of COMP1 50. Thus, the offset voltage of COMP1 50 is important to the performance of DMC 18, and has been minimized as discussed in section B, below. A worst case offset voltage of ±3.4 mV for 36 parts was measured for the low-offset COMP1 50 on a test chip.

Capacitor mismatch and unequal switch-induced error voltages are both additional sources of mismatch between DMCs 18. However, as mentioned in section E, below, mismatches in switch-induced errors are a very small percentage of the full-scale voltage, and can be neglected for most applications, including AVQ 10. Thus, comparator offset voltage and capacitor mismatch are the main limitations to matching between separate DMCs 18 on AVQ 10. Measured results on a test chip showed that separate DMCs 18 were matched to between 8 and 9 bits of resolution.

A common-mode error voltage also exists in DMC 18 due to stray interconnect capacitances on the nodes n1–n16 of averaging circuit 40. As shown in FIG. 3, the nodes n1–n16 are connected to the poly2 side of the summing capacitors C1–C16 in averaging circuit 40. Stray capacitances are unavoidable, and exist at all nodes. Fortunately, the stray capacitances on most nodes have no detrimental effects because the nodes are charged and discharged through low impedance voltage sources, which charge and discharge the stray capacitances as well. However, the stray capacitances on nodes n1–n16 of averaging circuit 40 are important because these nodes are not driven by a low impedance voltage source during Ph1. During charging the total charge stored on these parasitic sensitive nodes depends upon the common-mode voltage on the Vim input. Thus, during Ph1, the Vavg voltage at output 74 of averaging circuit 40 is somewhat dependent upon the common-mode voltage on the Vim input, for a constant difference between Vip and Vim.

This common-mode error voltage is approximately equal to a fixed percentage of the common-mode voltage difference between Vim input values. As a result, the common-mode error voltage decreases in magnitude as the distance between adjacent codevectors in the vector space decreases. For codevectors spaced reasonably close together in the vector space any common-mode differences between components of adjacent vectors is a small percentage of the full-scale input voltage. Thus, the common-mode error can be made negligible by making it a small percentage of the common-mode voltage differences, which results in a very small percentage error with respect to the full-scale input voltage.

Careful layout was done on the stray sensitive nodes in DMC 18 to minimize the stray capacitances as much as possible. Electrostatic shielding of the stray sensitive nodes from the substrate by the bottom plate of each poly2 to poly1 capacitor was incorporated. This results in increased poly2 to poly1 capacitance, and greatly reduced unwanted poly2 capacitance to the substrate. These unwanted stray capacitances also have a slight voltage dependence because of reversed biased pn junctions associated with the source and drain diffusion of the switching transistors. The source and drain of these transistors were minimized to reduce this voltage dependence. In addition, preferably only n-channel transistors are used for switching in averaging circuit 40, rather than both n and p-channel transistors as is common with CMOS couplers, to minimize diffusion area. The summing capacitors C1–C16 in FIG. 3 were sized such that the unwanted stray capacitances associated with nodes n1–n16 were approximately only 1% of the total capacitance per node. Measurements on a test chip verified that a common-mode error voltage of approximately 1% per volt existed for DMC 18. As previously mentioned, for codevectors spaced reasonably close together in the vector space this common-mode error is negligible, because any common-mode differences between components of adjacent vectors will be a small percentage of the full-scale input voltage.

The source and drain diffusions connected to the summing capacitors in averaging circuit 40 also result in diode leakage currents. Consequently, the charge stored on the summing capacitors is slowly lost, resulting in a minimum frequency of operation. Calculations indicate that this diode leakage loss is negligible for frequencies $\geq 100$ Hz and temperatures $\leq 75°$ C. Measured results on test chips confirmed that diode leakage was negligible for clock frequencies $\geq 100$ Hz.

The maximum operating frequency of AVQ 10 is also limited by DMC 18. In a test chip, the input voltage setup time of COMP1 50 in absolute difference circuit 36 limits the operating frequency to 1 MHz or less, and is discussed further in section B, below. In addition, the full-scale input voltage range becomes limited at higher frequencies because of the charging time of the summing capacitors C1–C16 in averaging circuit 40. This charging time is reduced for increasing gate-to-source voltages on the input switching transistors in averaging circuit 40. Consequently, the full-scale input voltage range can be extended at higher frequencies by increasing the voltage difference between Vdd and Vss. Measured results on test chips for Vdd–Vss=5.0 V, and a clock frequency of 1 MHz showed that for 8-bit resolution the maximum analog input voltages were limited to approximately (Vdd–2.0) V, because of errors associated with summing capacitor charging time. This upper limit is only for frequencies near 1 MHz, and is 0.5 V less than the common-mode input range of COMP1 50. By increasing Vdd–Vss to 6.0 V, between an 8 and 9 bit resolution was measured for an upper limit of (Vdd–1.5) V at 1 MHz. Thus, the full-scale input voltage of AVQ 10 can be extended by increasing the supply voltages of the chip. However, the SCNA20 process is a 5 V process, and as a consequence may have long-term reliability problems when operated at Vdd–Vss$\geq$6 V.

3. Best Match and Address Generation Circuit (BMAG)

BMAG 30 determines which DMC 18 has the minimum distortion, and then generates the corresponding binary address. In AVQ 10, the best match and address generation circuit is referred to as the BMAG 30, and there are 16 DMCs 18 and 16 corresponding 4-bit binary addresses. Larger distortions result in output voltages that are further below Agnd from DMC 18. Thus, the best match voltage is the voltage closest to Agnd (which is not necessarily earth ground or the same as another ground in a system).

a. BMAG4 Circuit

Figure 5:
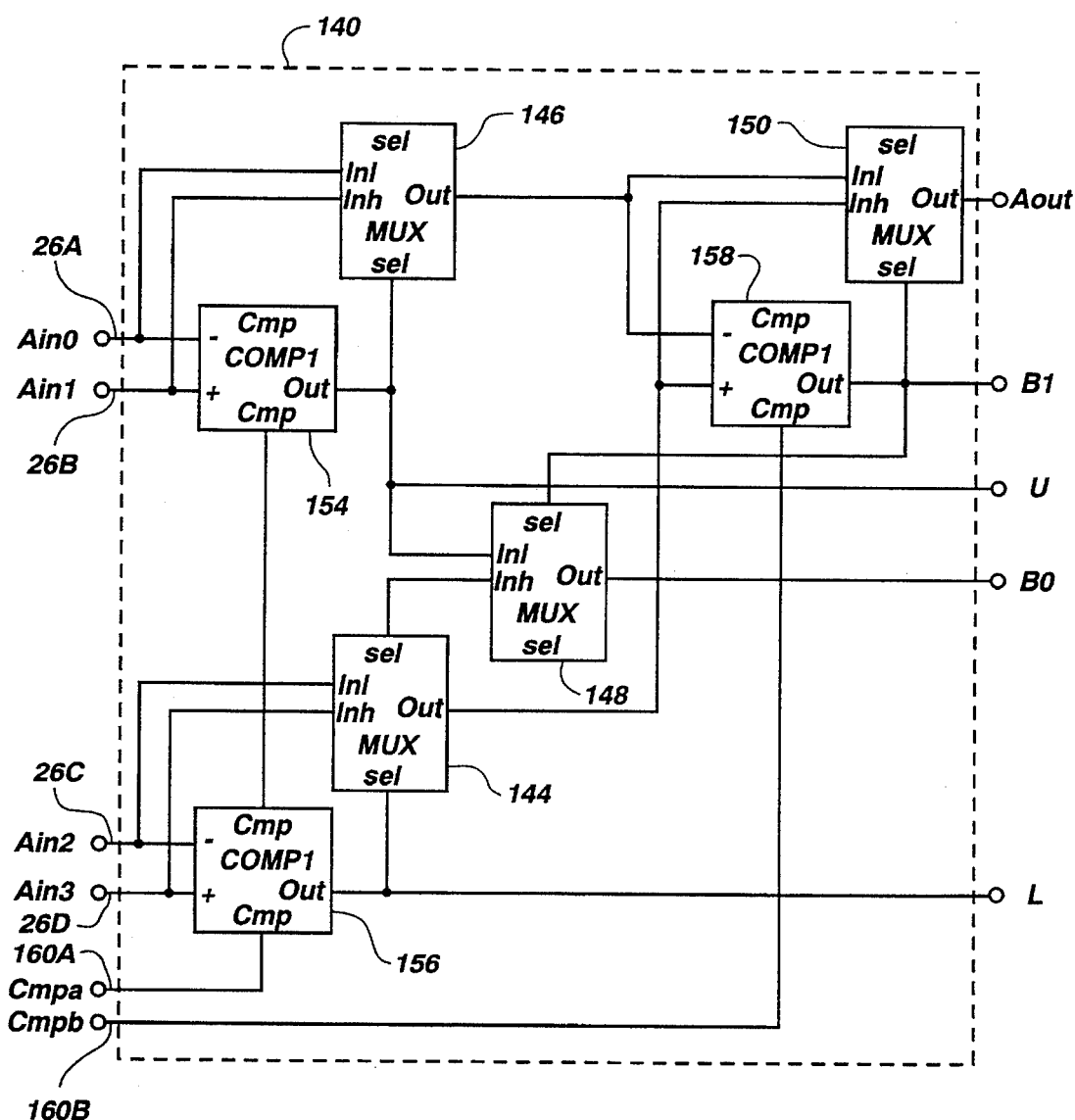
FIG. 5 is a schematic of a BMAG4 best match and in one of the distortion measuring circuits of the AVQ of address generation circuit.
Figure 6:
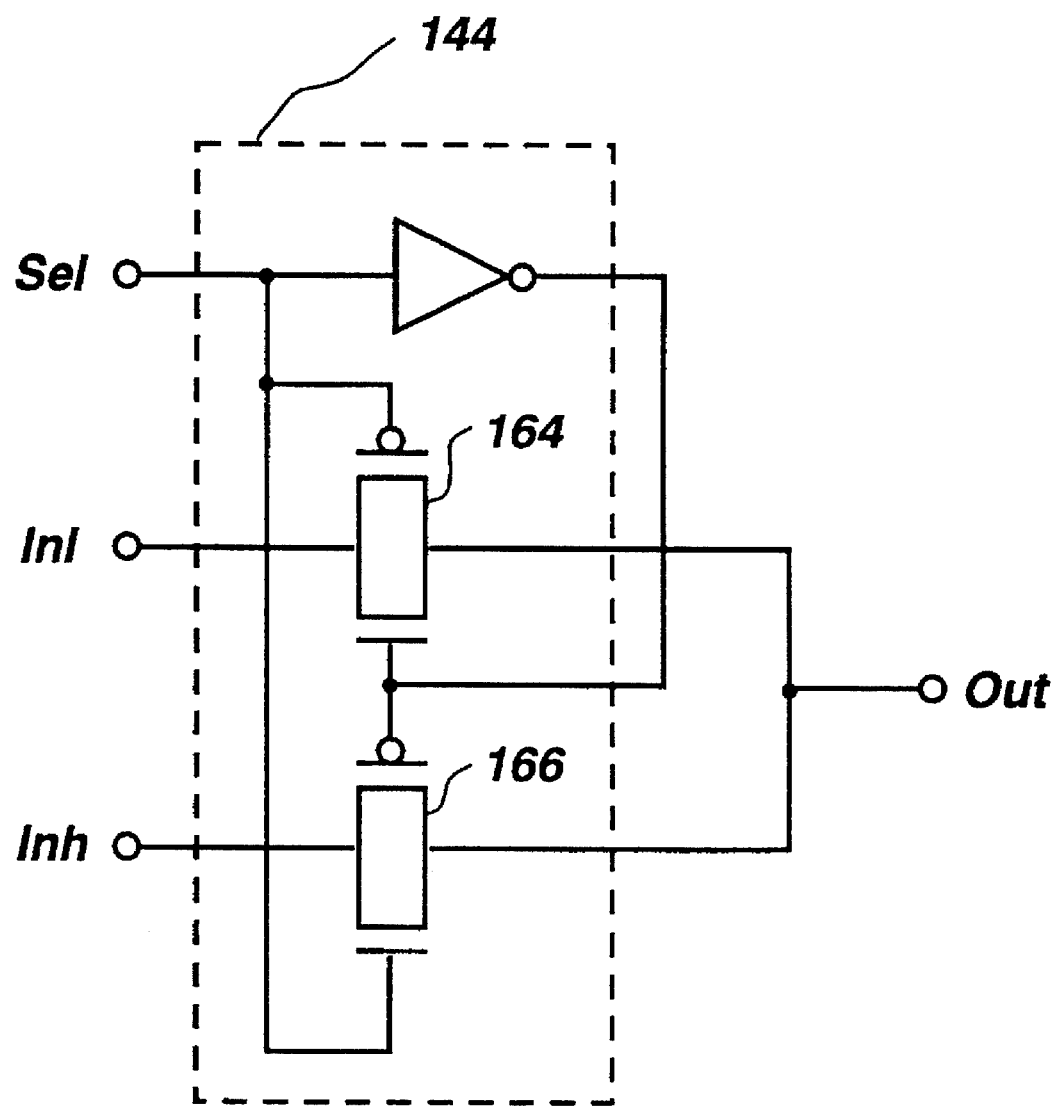
FIG. 6 is a schematic of a MUX 2–1 multiplexer circuit.

The operation of BMAG 30 can be illustrated with the conceptually simpler four-input voltage version of the best match and address generation circuit referred to as the BMAG4. BMAG4 140 is shown in FIG. 5 and includes four 2–1 multiplexer (MUX) circuits 144, 146, 148, and 150, and three COMP1 voltage magnitude comparators 154, 156, and 158. MUX circuit 144 is a CMOS multiplexer circuit used for both the analog and digital signals, and is shown in FIG. 6. The digital input Sel is the select input to MUX circuit 144, and determines which input gets passed to the output through CMOS couplers 164 and 166. When Sel=0, the input Inl is passed to the output. When Sel=1, Inh is passed to the output. (Note that in MUX 144, the top Sel is electrically connected to the bottom Sel.) MUX circuits 146, 148, and 150 are the same as MUX circuit 144.

COMP1s 154, 156, and 158 (shown in FIG. 5) are the same as COMP1 50 in absolute difference circuit 36. If the plus input is larger than the minus input, then Out=1 and Outn=0, and vice versa if the plus input is less than the minus input. The details of the of the COMP1 circuit are given in section B.1, below.

BMAG4 140, shown in FIG. 5, works similarly to a single elimination type of tournament with COMP1s 154, 156, and 158 deciding which of the analog input voltages continue to the next level by controlling MUX circuits 144, 146, and 150. The first level of comparison is performed by COMP1s 154 and 156, controlled by a Cmpa signal on conductor 160A. When Cmpa rises, the four analog input voltages Ain0–Ain3 are compared by COMP1s 154 and 156. The digital outputs of COMP1s 154 and 156 drive the Sel inputs of the associated MUX circuits 144 and 146, deciding which two of the four analog input voltages get passed on to the second level of comparison, which is initiated when a signal Cmpb on conductor 160B rises. COMP1 158 output from the second level of comparison drives the select input to MUX 150, deciding which of the input voltages becomes the best match voltage Aout, which is the voltage closest to Agnd.

The 2-bit binary address of the four analog inputs is also generated from the BMAG4 circuit shown in FIG. 5. The analog input Ain0 corresponds to the binary address 00, an Ain3 corresponds to address 11. The B1 output from BMAG4 140 is the most significant bit (MSB) of the binary address. B1 equals zero if the best match voltage came from analog inputs Ain0 or Ain1, and equals one if the best match voltage came from analog inputs Ain2 or Ain3. The least significant bit (LSB) of the binary address is B0, and is selected by B1 through MUX 148 in FIG. 11. The digital outputs L and U from BMAG4 140 are the lower and upper outputs, respectively, and (in the case of BMAG4 190) are used in BMAG 30.

b. BMAG Circuit

Figure 7:
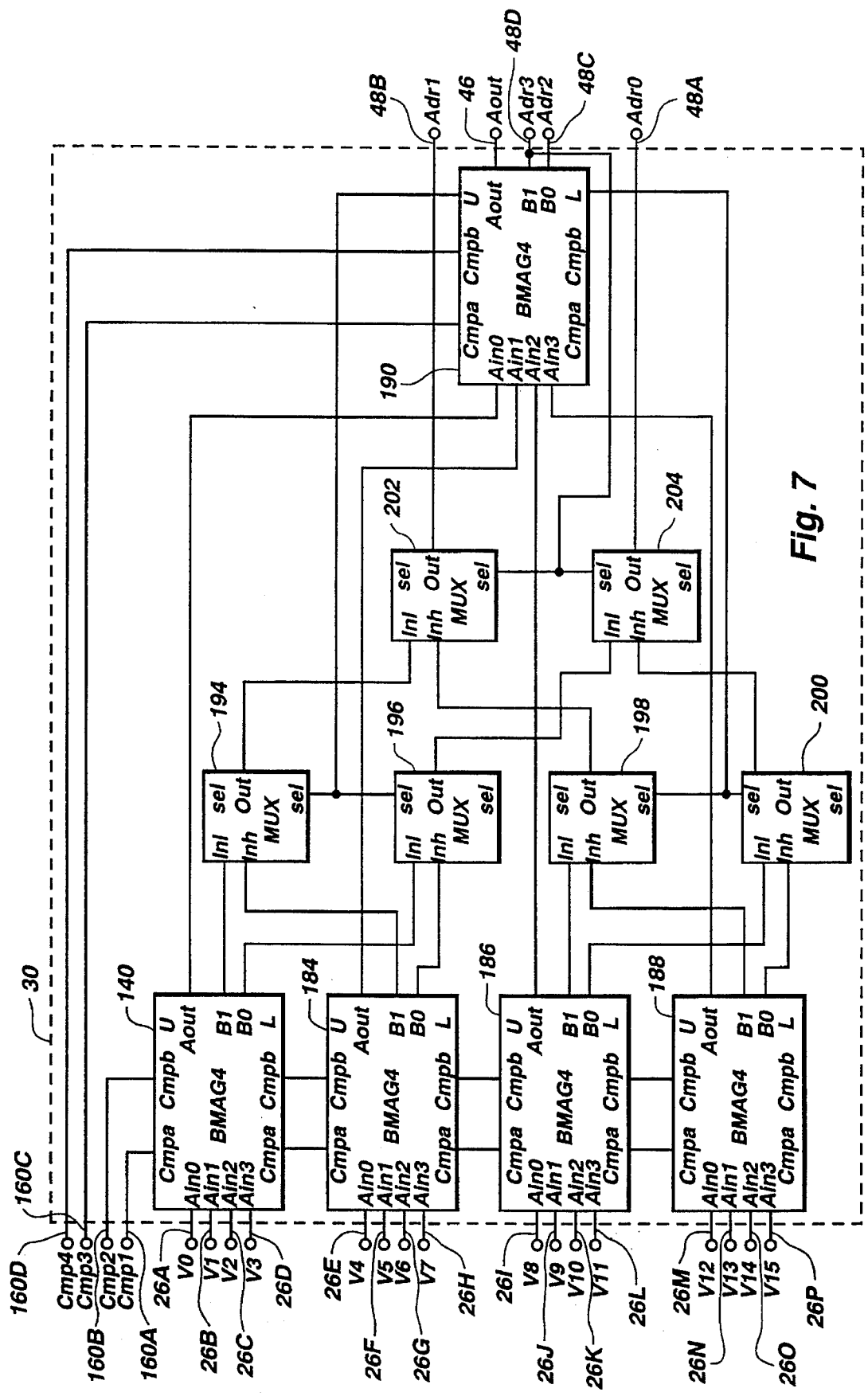
FIG. 7 is a schematic of a best match and address generation circuit of the AVQ of FIG. 1.

Referring to FIG. 7, BMAG 30 has 16 input conductors 26A–26P (also shown in FIG. 1), which carry signals V0–V15 from DMCs 18A–18P, respectively. BMAG 30 provides the best match analog voltage Aout at output 46 and the corresponding 4-bit binary address Adr0, Adr1, Adr2, and Adr3 at outputs 48A, 48B, 48C, and 48D, respectively. Input voltage V0 has address 0000, and V151 has address 1111. As shown in FIG. 7, BMAG 30 includes BMAG4 circuit 140 (also in FIG. 5), and four other BMAG4 circuits 184, 186, 188, and 190 (which are the same as BMAG4 circuit 140). BMAG 30 also includes six MUX circuits 194, 196, 198, 200, 202, and 204 (which are the same as MUX circuit 144). Four control signals Cmp1, Cmp2, Cmp3, and Cmp4 on conductors 160A, 160B, 160C, and 160D, respectively, are used to control the four levels of comparisons required to find the largest of the 16 input voltages to BMAG 30. Control signals Cmp1, Cmp2, Cmp3, and Cmp4 are generated in timing and control logic 32 from a buffer 2 (BUF2) circuit 214 (shown in FIG. 10 and described below). Control signals Cmp1 and Cmp2 control the two levels of comparison occurring in BMAG4 circuits 140, 184, 186, and 188. After these comparisons have been completed, the four largest analog voltages are passed on to the final BMAG4 circuit controlled by signals Cmp3 and Cmp4. MUX circuits 194, 196, 198, 200, 202, and 204 are used to pass on the appropriate COMP1 digital output values, resulting in the lower two significant bits Adr0 and Adr1 of the 4-bit binary address. The upper two significant bits Adr2 and Adr3 of the address are generated in BMAG4 190.

4. Timing and Control Logic

Timing and control logic 32 includes a timing generator circuit 218, BUF1 66, BUF2 214, and an address ready circuit 222, which are each described in the following sections.

a. Timing Generator Circuit

Figure 8:
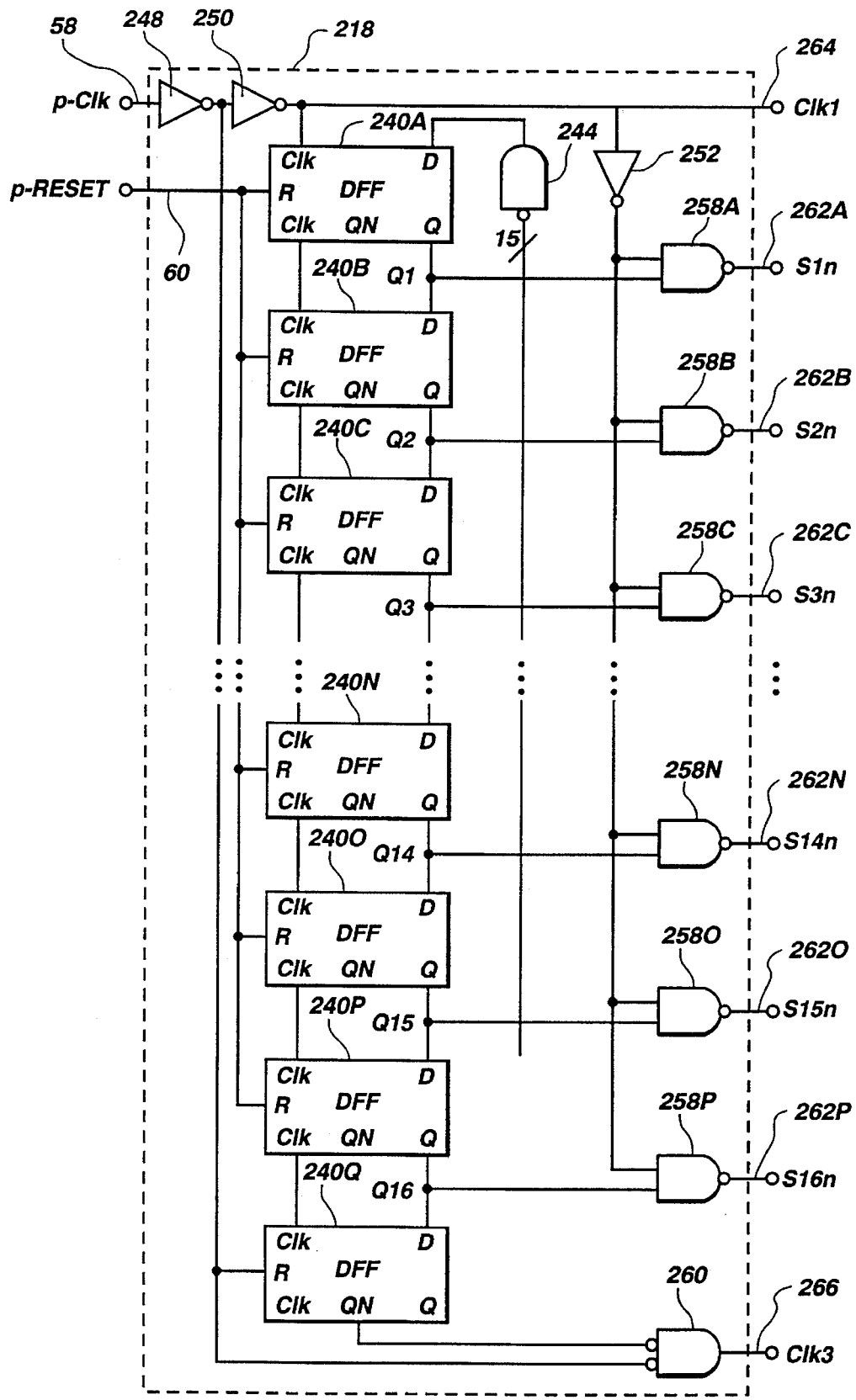
FIG. 8 is a schematic of a timing generator circuit in the timing and control logic of the AVQ of FIG. 1.

Referring to FIG. 8, timing generator circuit 218 is the main timing generator for AVQ 10 and is implemented using digital standard cells developed for AVQ 10 that are briefly discussed in section B.4, below. Conductors 58 and 60 are connected to pins p-Clk and p-Reset (shown in FIG. 1), which are external inputs to AVQ 10 chip. As previously mentioned, a high voltage at pin p-Reset, causes AVQ 10 to begin processing a new vector and allows synchronization of AVQ 10 with an external device. Timing generator circuit 218 automatically cycles from one vector to the next. Therefore, applying a high voltage to pin p-Reset is only required once for initial synchronization.

Timing generator circuit 218 is essentially a 17bit shift register that shifts a digital logic high voltage through D-flip/flops (DFF) 240A, 240B, . . . , 240P, and 240Q (collectively DFFs 240), which are rising edge triggered master slave DFFs with an asynchronous reset. The R input to DFFs 240 is an asynchronous reset that causes the Q outputs to be zero when the R input is a logic high voltage. Therefore, upon the application of a logic high voltage at the R input, all the Q outputs from DFFs 240 become zero, except the DFF 240Q, which is reset upon each falling edge of the Clk input.

Outputs Q of DFFs 240A, 240B, . . . , 240P are connected to nodes Q1, Q2, . . . , Q16, respectively. Pin p-Clk is connected through inverters 248, 250, and 252 to one input of each of 2-input NAND gates 258A, 258B, . . . , 258P. The other input of each of 2-input NAND gates 258A, 258B, 258P are connected to nodes Q1, Q2, . . . , Q16, respectively.

A 15-input NOR gate 244 provides a logic high voltage to the D input of DFF 240A when the voltages at nodes Q1–Q15 are each zero. Upon consecutive rising clock edges, the logic high voltage applied to the D input of DFF 240A is passed from the D input to the Q output of DFFs 240A to DFF 240Q creating logic high voltages successively at nodes Q1–Q16. This logic high value shifting down DFFs 240 causes signals S1n, S2n, . . . , S16n to be created by 2-input NAND gates 258A, 258B, . . . , 258P, respectively. The signals S1n–S16n are carried on conductors 262A, 262B, . . . , 262P and inverted by BUF1 66 (in FIG. 9) to create signals S1–S16, which control the charging of capacitors C1–C16 in averaging circuit 40. A Clk1 signal is provided on conductor 264 at the output of NAND gate 250. NAND gates 258A–258P make signals S1n–S15n nonoverlapping by disabling the outputs during half of the signal Clk1 clock cycle.

The QN output of DFF 240Q and the output of inverter 248 are connected to the two inputs of NOR gate 260, which generates a signal Clk3 on conductor 266 at the completion of a vector.

b. BUF1 Circuit

Figure 9:
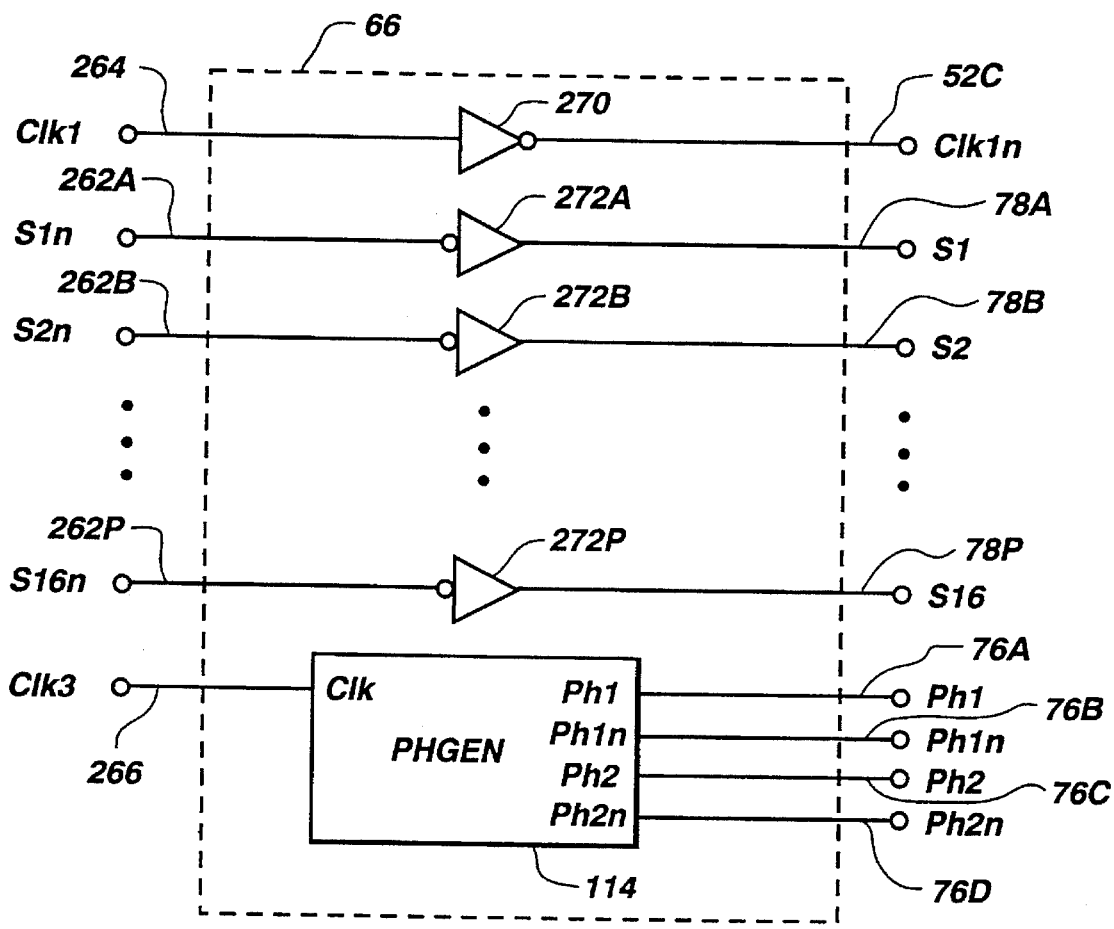
FIG. 9 is a schematic of a BUF1 buffer circuit used in the AVQ of FIG. 1.

Referring to FIG. 9, the timing signals generated by the timing generator circuit 218 are buffered by BUF1 66 before being used by the associated circuitry. An inverter 270 inverts the signal Clk1 (from timing generator circuit 218 in FIG. 8) to produce a signal Clk1n, which controls COMP1 50 in absolute difference circuit 36 (in FIG. 2).

Inverters 272A, 272B, . . . , and 272P invert the signals S1n, S2n, . . . , and S16n, respectively, (from timing generator circuit 218) to signals S1, S2, . . . , and S16, respectively. Signals S1–S16 are used by averaging circuit 40 in FIG. 3.

The signal Clk3 is received by PHGEN circuit 114, which produces in response thereto, the signals Ph1, Ph1n, Ph2, and Ph2n. PHGEN circuit 114 (in FIGS. 9 and 17) is a phase generator circuit for generating the 2-phase nonoverlapping timing signals Ph1, Ph1n, Ph2, and Ph2n, and are used in averaging circuit 40 and sample-and-hold circuit 44. The details of the PHGEN circuit are discussed in section B.3, below.

c. BUF2 Circuit

Figure 10:
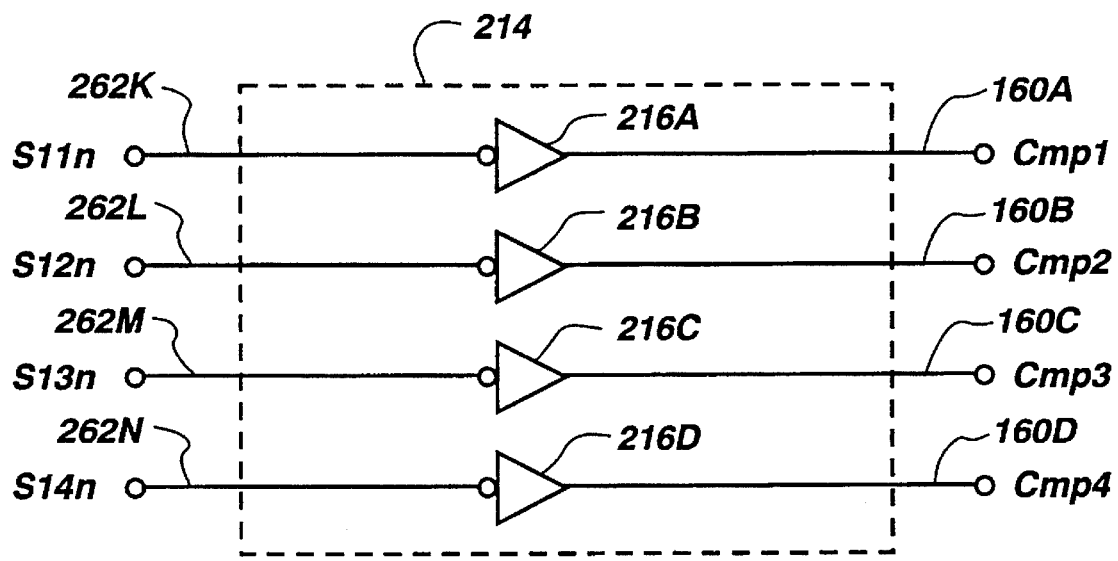
FIG. 10 is a schematic of a BUF2 buffer circuit employed in the AVQ of FIG. 1.

Referring to FIG. 10, BUF2 214 includes inverters 216A, 216B, 216C, and 216D which receive signals S11n, S12n, S13n, and S14n on conductors 262K, 262L, 262M, and 262N and generate and buffer control signals Cmp1, Cmp2, Cmp3, and Cmp4 on conductors 160A, 160B, 160C, and 160D. Signals Cmp1–Cmp4 are received by BMAG 30 and allow sample-and-hold circuit 44 sufficient settling time after acquiring a new sample.

d. Address Ready Circuit

Figure 11:
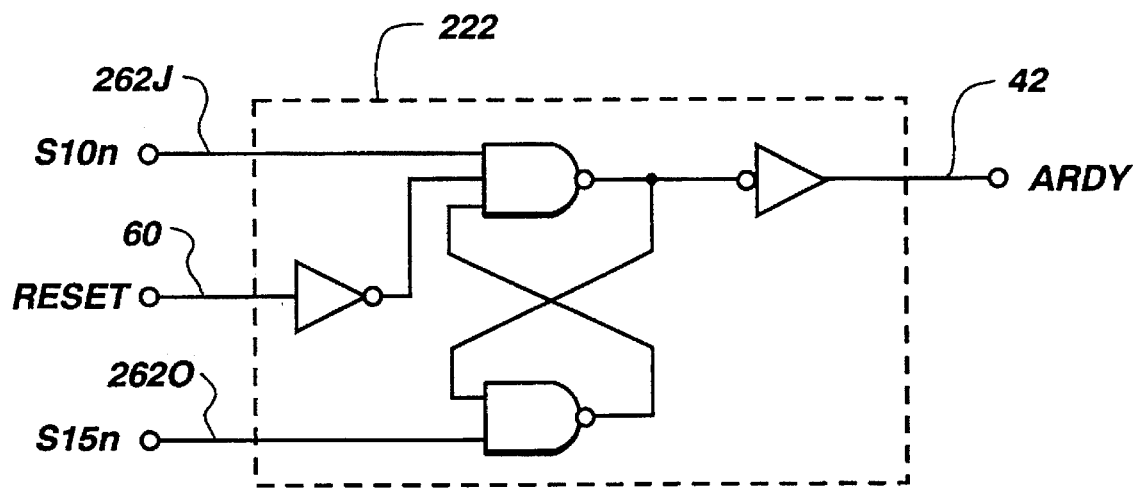
FIG. 11 is a schematic of an address ready circuit in the timing and control logic of the AVQ of FIG. 1.

Referring to FIG. 11, address ready circuit 222 generates the Ardy signal on conductor 42 which indicates when the 4-bit best match address for the previous input vector is valid. Conductor 42 is electrically connected to pin p-Ardy. The asserted high signal Ardy is set to zero by Reset. Ardy is also set to zero when S10n becomes asserted, and stays zero until S15n becomes asserted. The signals S10n and S15n are generated from timing generator circuit 218. A new address is computed by BMAG 30 between the time S10n and S15n are asserted. Ardy being asserted means that the address associated with the previous input vector is now available.

e. AVQ 10 Timing

Figure 12:
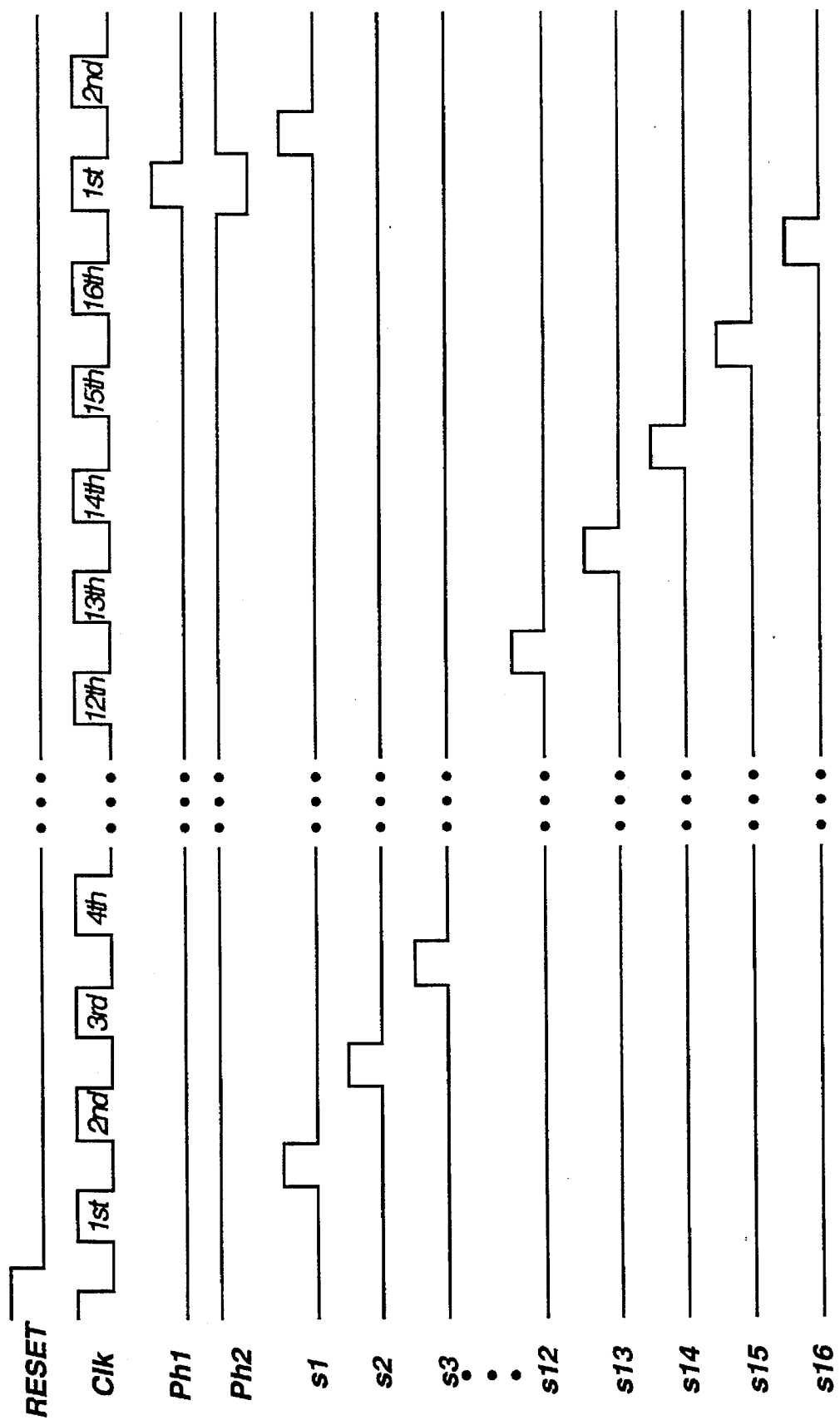
FIG. 12 is a diagram of the timing signals used in the AVQ of FIG. 1.

The main timing signals used in AVQ 10 are illustrated in FIG. 12. As previously mentioned Clk and Reset are external input signals to AVQ 10, with Clk being the timing reference for AVQ 10. Reset is an asynchronous input used to initiate a vector computation cycle, which comprises of all of the timing and control signals used to compute the best match address for 16 component vectors. The analog input voltages at the pins p-Vinput and p-Vcb0–p-Vcb15 to AVQ 10 are to be set up for a comparison when Clk is high. Upon a falling edge of Clk, a comparison is initiated in COMP1 50 of each absolute difference circuit 36 by Clk1n, and one of the switch signals S1–S16 selects the appropriate summing capacitor to be charged in each averaging circuit 40. The switch signals S1–S16 are nonoverlapping periodic signals.

The timing signals Ph1 and Ph2 are phase one and phase two, respectively, for n-channel transistors 94A, 94B, 96A, and 96B of CMOS couplers 104, 106, 108, and 110 of sample-and-hold circuit 44. Signal Ph1 is also used in averaging circuit 40. The asserted low signals Ph1n and Ph1n are not shown in FIG. 12, but are used to control the p-channel coupler transistors in sample-and-hold circuit 44. Averaging circuit 40 averages all of the distortion components stored on the 16 summing capacitors during Ph1. Sample-and-hold circuit 44 also samples the output Vavg of averaging circuit 40 during this phase. Sample-and-hold circuit 44 then holds the sampled averaging output during Ph2 for use by BMAG 30 while DMC 18 begins computations on the next input vector.

5. Layout of AVQ 10

As mentioned in section E, below, the SCNA20 process currently offered by MOSIS was chosen to implement AVQ 10. This analog CMOS process is a double polysilicon process, so linear poly1 to poly2 capacitors can be efficiently implemented. This resulted in area efficient and well matched switched-capacitor circuits, at the expense of increased risk and design time because of the lack of available standard cells for this process. Digital standard cells and bonding pads were developed for AVQ 10 by the inventor, and are discussed in more detail in section B.4, below. In addition, a "full-custom" layout of all of the analog sections was done. Full-custom layout is very time consuming as compared to automated layout techniques, but is often used to optimize the performance of analog VLSI circuits. One of the main layout challenges was preventing the noisy digital circuitry from corrupting sensitive analog signals. The effect of the digital circuitry upon the analog circuitry was minimized by physically separating the digital and analog sections as much as possible, and providing separate internal digital and analog power supply buses. These internal power buses were all connected to the main Vdd and Vss buses surrounding AVQ 10.

Figure 13:
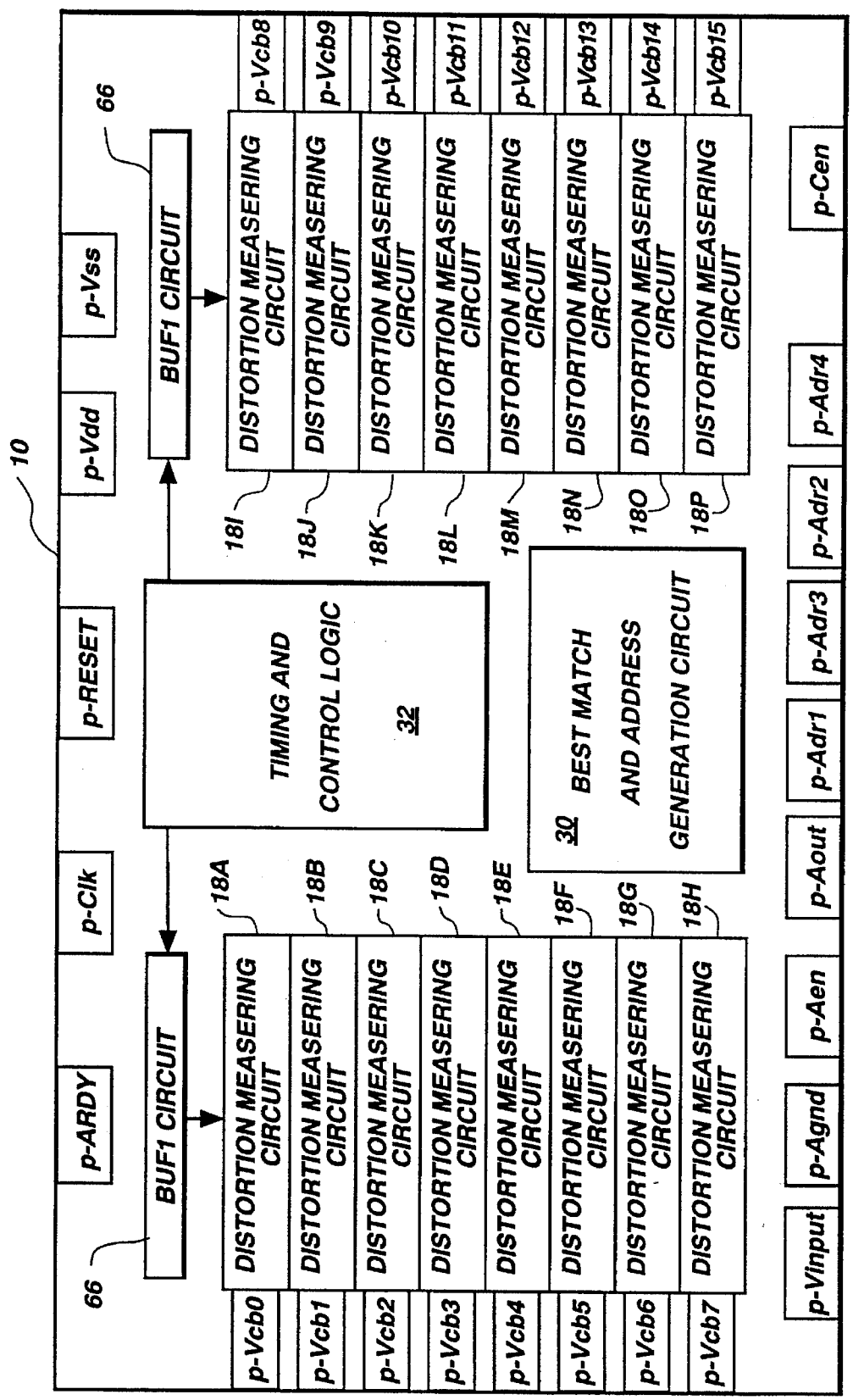
FIG. 13 is a block diagram illustrating the physical layout of the AVQ of FIG. 1.

After considering the interconnections required, the separation of digital and analog circuitry, and the aspect ratio of the chip, the inventor arrived at the layout illustrated in FIG. 13 for AVQ 10. As can be seen in FIG. 13, AVQ 10 has two separate banks of DMCs 18 that share common control signals. This was done to improve the aspect ratio of the chip, and to reduce the large capacitive load that each BUF1 66 drives. Also, each DMC 18 was arranged such that the control signals passed over the circuit from top to bottom in metal-2. This resulted in an area efficient layout that simplified the interconnection of the control signals to DMCs 18. BMAG 30 was arranged such that half of the analog inputs come from each side to allow easy interface to the analog outputs of DMCs 18. The resulting layout of AVQ 10 is area efficient and provides good separation of the digital and analog circuitry.

In one embodiment, the AVQ 10 die size is 4518 µm× 2783 µm (178 µmil×110 mil), for a 2-µm CMOS process, and uses 30 pins. This compares with a die size of 7493 µm× 7899 µm (295 mil×311 mil), and the 120 pins required for the CPC-16, which is a digital VQ chip designed at Utah State University and implemented in a 1.6-µm CMOS process. These numbers illustrate the advantage in die size and pin count of the analog versus digital VLSI approaches to VQ.

6. Size Estimates

The layout of AVQ 10 can readily be expanded to provide a larger number of codevectors for a given chip. Table 2 gives size estimates and pin counts of AVQ chips ranging from 16 to 256 codevectors for 2-µm SCNA20 process. The vector dimension equals 16 in all cases. In addition, as is discussed in section C, below, it is possible to add analog ROM circuits to an AVQ chip to provide on board codevector storage.

TABLE 2

| Number of Codevectors | Size (W×L) in mils without codevectors | Pin Count without codevectors | Size (W×L) in mils with 8-bit codevectors |
|---|---|---|---|
| 16 | 178×110 | 30 | 252×110 |
| 32 | 182×180 | 47 | 256×180 |
| 64 | 327×321 | 80 | 401×321 |
| 128 | 520×604 | 145 | 598×604 |
| 256 | 903×1168 | 274 | 977×1168 |

The size estimates of AVQ chips with on board analog codevectors of 8-bit resolution are also given in Table 2. The pin count for AVQ chips with on board codevectors equals $(10+\log_2 N)$ pins, where N is the number of codevectors, because codevector input pins are no longer necessary.

VLSI chips of very large die size are not practical to manufacture because the probability of defects is near unity. Defect densities and yield models indicate that die sizes approaching 1 inch (1000 mils) per side are currently not practical to manufacture. Consequently, an AVQ chip with 256 codevectors is currently not economically feasible in the 2-µm SCNA20 process. However, storing and processing 128 codevectors on a single AVQ chip is feasible, and is a much higher circuit density than currently offered by digital approaches.

B. Subblocks of AVQ

The following section describes detailed information about COMP1 50, OPN5 90, PHGEN circuit 114, and the standard cells developed for AVQ 10.

1. COMP1 Circuit

AVQ 10 employs voltage magnitude comparators in absolute difference circuit 36 and BMAG 30. In both, the comparator offset voltage adds directly to the analog-to-digital conversion error, so low offset voltage is used. Low power dissipation and small size are also desired because there are 31 comparators on AVQ 10. In addition, a wide common-mode input voltage range and relatively fast operating speed are desirable. A comparator that meets all of these conditions and uses only one control signal is shown in FIG. 14.

Figure 14:
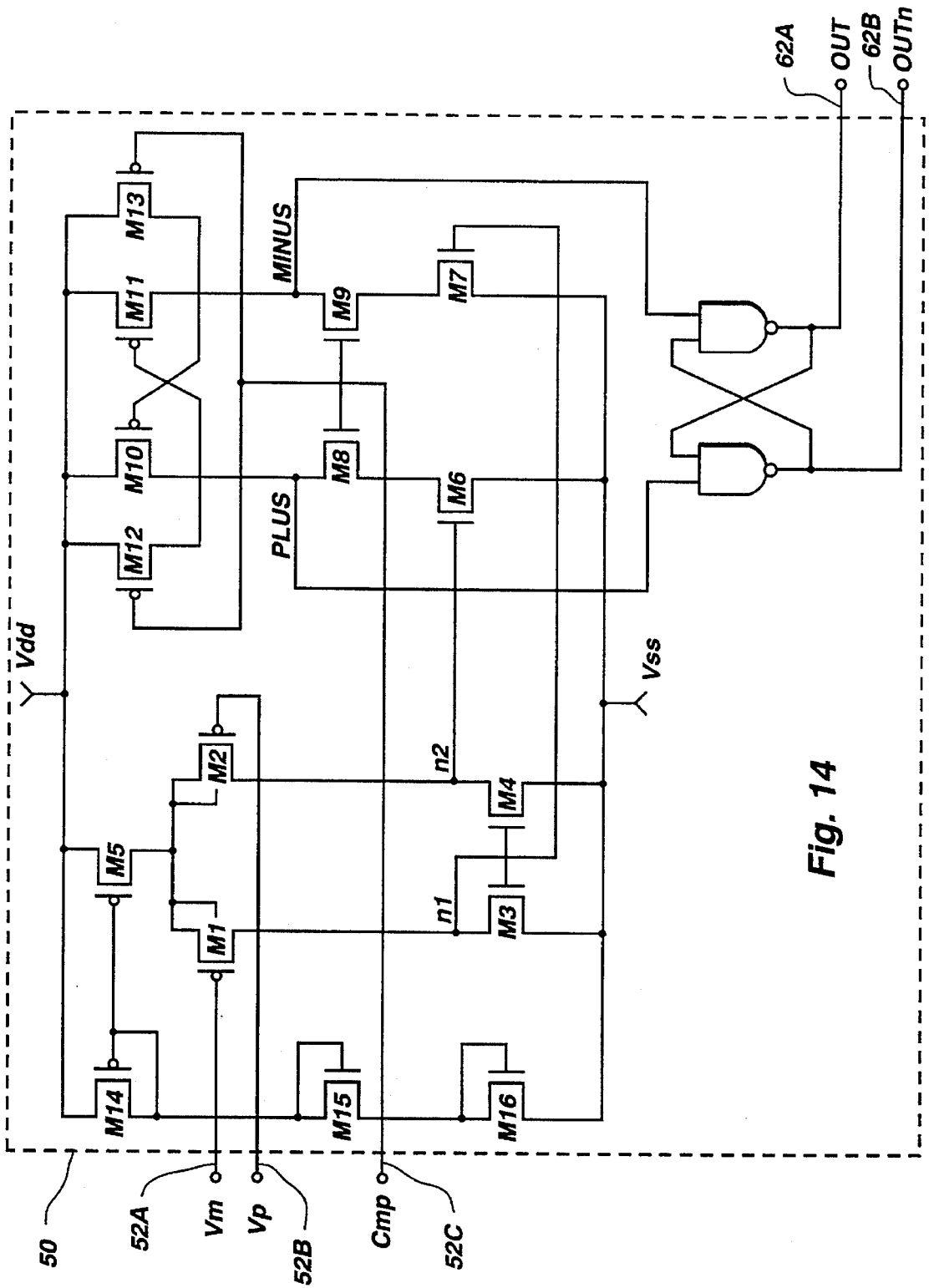
FIG. 14 is a schematic of a COMP1 magnitude comparator and latch circuit employed in various circuits in the AVQ of FIG. 1.

Referring to FIG. 14, COMP1 50 is a voltage magnitude comparator followed by a cross-coupled NAND output latch. COMP1 50 receives signals Vm, Vp, and Cmp at inputs 52A, 52B, and 52C and works as follows. Transistors M1–M4 form a differential input stage that is biased by transistors M5, M14, M15, and M16. This stage amplifies the voltage difference between Vm and Vp, providing a larger difference for the second stage.

Transistors M10 and M11 form a regenerative p-channel flip-flop, which is initialized by transistors M12 and M13 when the control signal Cmp is low. Transistors M8 and M9 connect the p-channel flip-flop to the matched n-channel pull-down transistors M6 and M7 when Cmp is a logic high voltage.

The dynamic operation of COMP1 50 includes an initialization interval and a comparison interval. The initialization interval occurs when Cmp is a logic low voltage, causing the p-channel flip-flop to be initialized in preparation for the next comparison. The analog inputs Vm and Vp to the comparator are to be set up for comparison during this interval, while the cross-coupled NAND output latch maintains the result of the previous comparison. Upon the rising edge of Cmp, the transistors M8 and M9 connect the initialized p-channel flip-flop to the matched pull-down transistors M6 and M7, and the comparison interval begins. A small difference between the inputs Vm and Vp results in a relatively large difference in the gate-to-source voltages of the matched transistors M6 and M7, due to the gain of the differential input stage. This voltage difference causes the p-channel flip-flop to be forced into one of its two stable states, which then drives the output latch. The digital output of each comparison is then stored in the output latch for use during the next initialization interval.

The maximum operating frequency of COMP1 50 is limited by the settling time of the input stage during the initialization interval. PSPICE simulations of the extracted layout using typical process parameters showed a maximum operating frequency of 1 MHz for COMP1 50. Simulations also showed that the comparator output signal was stored in the output latch within 30 ns of the start of the comparison interval.

As previously mentioned, small area, wide input common-mode range, low power dissipation, and low offset voltage are features of COMP1 50. In one embodiment, comp1 50 is 204 μm tall by 180 μm wide in a 2-μm CMOS process, which is smaller and has a simpler interface than previously reported comparators that incorporate offset canceling techniques. See J. T. Wu et al., "A 100-Mhz Pipelined CMOS Comparator," *IEEE Journal of Solid-State Circuits*, vol. 23, no. 6, pp. 1379–1385; B. J. McCarrol et al., "A High Speed CMOS Comparator for Use in an ADC," *IEEE Journal of Solid-State Circuits*, vol. 23, no. 1, pp. 159–165, February 1988. Recently, comparators that are smaller, faster, and have much lower offset voltage than COMP1 50 have been reported in B. Razavi et al., "Design Techniques for High-speed, High-resolution Comparators," *IEEE Journal of Solid-State Circuits*, vol. 27, no. 12, pp. 1916–1926, December 1992. However, COMP1 50 has lower power dissipation and simpler control signal requirements than these new low offset voltage comparators.

The power dissipation of COMP1 50 is quite low because only the input stage transistors M1–M5 and the biasing transistors M14–M16 conduct static current. As a result, one embodiment of COMP1 50 has a typical static current of 60 μA for 5.0 V supplies, yielding a static power dissipation of only 0.3 mW.

The minimum common-mode input range of COMP1 50 is limited by M1 and M2 coming out of saturation for inputs near Vss. Applying the MOSFET equations for saturation to the circuit in FIG. 14 results in a minimum common-mode input voltage given in equation (10), below:

$$Vin(min) = \left( \frac{Id5}{Kpn(W4/L4)} \right)^{1/2} + Vtn - |Vtp| + Vss, \quad (10)$$

where Id5 is the drain current of M5, Kpn is the transconductance parameter for an n-channel MOSFET, W4 is the channel width of M4, L4 is the channel length of M4, Vtn is the n-channel MOSFET threshold voltage, and Vtp is the p-channel MOSFET threshold voltage. Equation 10 illustrates that transistors M1 and M2 eventually leave saturation for common-mode input voltages near the Vss rail. If this occurs, the comparator suffers from relatively large offset voltages because of low first stage gain.

The maximum common-mode input range of COMP1 50 is limited by M5 coming out of saturation for inputs near Vdd. Applying the MOSFET saturation equations results in a maximum common-mode input voltage given in equation (11), below:

$$Vin(max) = Vdd - \left( \frac{2Id5}{Kpp(W5/L5)} \right)^{1/2} - \left( \frac{Id5}{Kpp(W1/L1)} \right)^{1/2} - |Vtp|, \quad (11)$$

where Kpp is the transconductance parameter for a p-channel MOSFET. As expected, operation up to the Vdd rail is not possible because of poor first stage gain resulting from M5 coming out of saturation.

One embodiment of COMP1 50 was designed to keep M1, M2, and M5 saturated for a 3 V common-mode input range extending from 1.5 V below Vdd to 0.5 V above Vss for Vdd– Vss=5.0 V, and typical process parameters. Larger common-mode input ranges are possible for larger voltage differences between Vdd and Vss. Because the minimum common-mode input range does not extend to Vss, AVQ 10 uses a Vss supply that is negative with respect to the minimum analog common-mode input-voltage.

Low offset voltage is achieved by having the transistor pairs M1–M2, M3–M4, and M6–M7 well matched, and by having sufficient gain in the first stage to overcome mismatches occurring elsewhere. The transistor pairs M1–M2, M3–M4, and M6–M7 are all laid out in a common centroid geometry to minimize transistor mismatch. In addition, the first stage was designed to have a typical voltage gain of 40, and as a result, transistor mismatches occurring in transistors M8–M10 in the second stage have negligible effect on the offset voltage.

Figure 15:
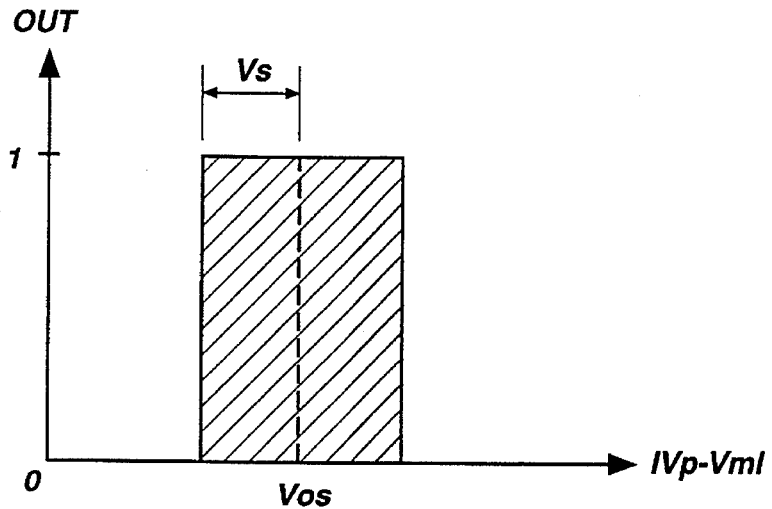
FIG. 15 is an illustration of comparator sensitivity and input-referred dc offset voltage Vos.

An ideal magnitude comparator has a digital output of one as long as Vp>Vm, and an output of zero for Vp<Vm. Uncertainty in the output exists for the dc input condition Vm=Vp. Because of noise, real comparators have a region of output uncertainty that is characterized by changing digital outputs for constant inputs. An input voltage parameter called the sensitivity is used to characterize the region of uncertainty, which is illustrated in FIG. 15. The sensitivity Vs is equal to ½ of the width of the input voltage range causing uncertainty in the comparator output. The input referred dc offset voltage Vos is equal to the voltage difference from the center of the region of uncertainty to where Vp=Vm.

Typically for high performance comparators ±(|Vos|$_{max}$+ |Vs|$_{max}$) is specified, as this is the worst-case error that can result from a comparison. For COMP1 50, measured results of 36 parts over the desired 3 V common-mode input range yielded $\pm(|Vos|_{max}+|Vs|_{max})=\pm(3.4+0.3)$ mV=$\pm 3.7$ mV, which is between 8 and 9 bits of resolution for a 3 V full-scale input voltage.

COMP1 50 shown in FIG. 14 is quite similar to the comparator described in A. Yukawa, "A CMOS 8-bit High-Speed A/D Converter IC," *IEEE Journal of Solid-State Circuits*, vol. SC-20, no. 3, pp. 775–779, June 1985, except that the n-channel regenerative flip-flop connected between the drain nodes of transistors M6 and M7 has been omitted, along with the swing clipping transistors in the input stage. In addition, a cross-coupled NAND output latch has been added which is used for AVQ 10 comparator applications. The n-channel flip-flop was removed because, although it increases the regeneration speed of the second stage, it also tends to regenerate any systematic offset voltages present. The input stage swing clipping transistors were also removed because the setup time of the input stage is limited by small changes in the input voltages rather than large changes.

PSPICE simulations of the extracted COMP1 50 layout revealed that the circuit has a negative systematic offset voltage, due to unequal voltages being coupled to nodes n1 and n2. When the Cmp signal rises, the drain voltages of both M6 and M7 rise rapidly, causing nodes n1 and n2 to rise because of the drain-to-gate overlap capacitances of transistors M6 and M7. Because the gate capacitances of transistors M3 and M4 are both tied to n1, the capacitance at n1 is much larger than the capacitance at n2. Consequently, a larger voltage is induced upon n2 than n1 when Cmp rises, resulting in a negative systematic offset. This offset voltage is reduced by the gain of the first stage and depends upon the rise time of Cmp. PSPICE simulations using typical process parameters showed that for a 2 ns rise time on Cmp the voltage induced upon n2 was greater than that induced upon n1 by 26 mV. Thus, for a typical first stage gain of 40, Vp is greater than Vm by at least (26 mV)/40=0.65 mV to overcome this systematic offset. Measured results of 36 parts with a square wave input clock yielded a mean offset voltage of −0.34 mV. Thus, the first-stage gain of COMP1 50 minimizes the systematic offset voltage to an acceptably low value.

2. OPN5 Circuit

Figure 16:
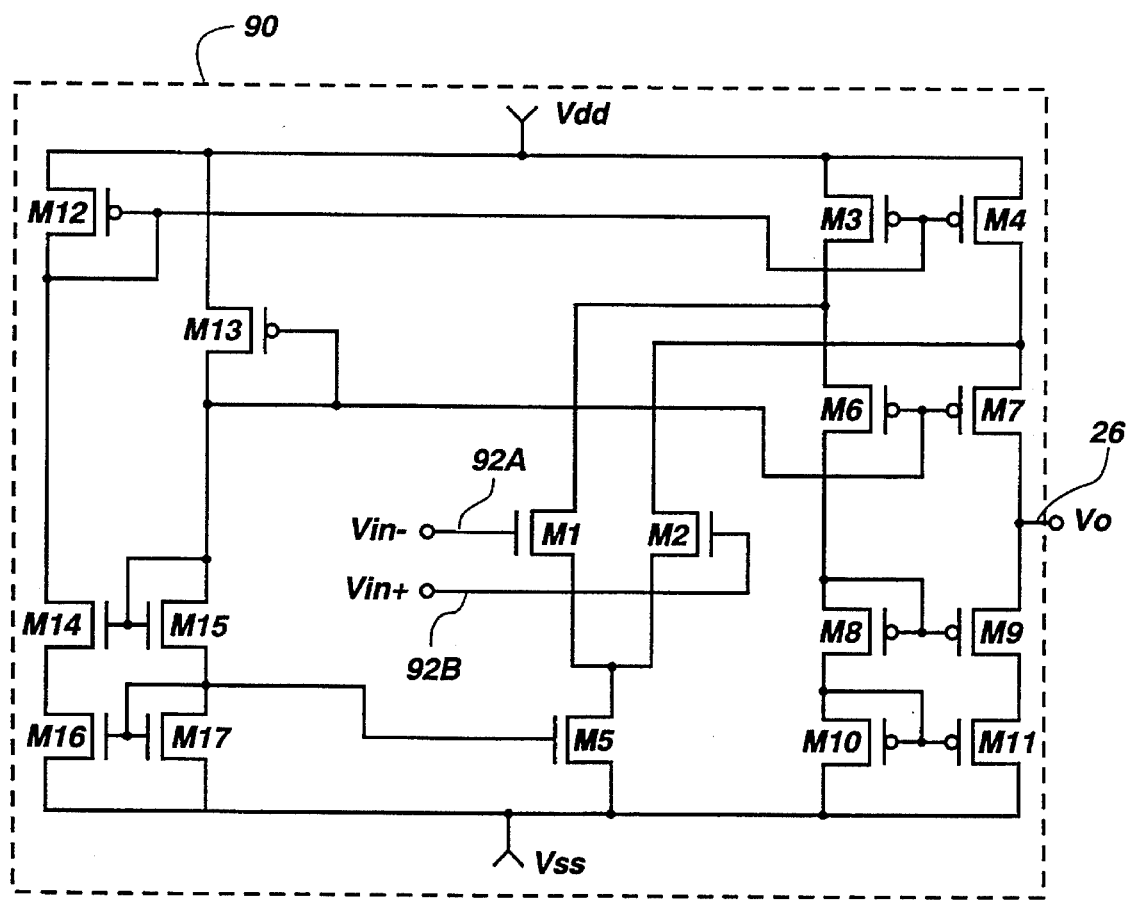
FIG. 16 is a schematic of an OPN5 operational amplifier circuit employed in the AVQ of FIG. 1.

Referring to FIG. 16, OPN5 90 is a folded cascode operational amplifier for use in sample-and-hold circuit 44. This op-amp configuration is commonly used for switched-capacitor applications, and works as follows. Transistors M3–M5 along with transistors M12–M17 set up the bias currents. Transistors M8–M11 form a cascode current mirror to provide a high impedance load for current differences between transistors M6 and M7. The common-gate transistors M6 and M7 create low impedance nodes at the drains of M1 and M2, and high impedance nodes at the drains of M8 and M9. The differential input transistors M1 and M2 conduct a portion of the bias current set up by transistors M3 and M4. These input transistors cause a current imbalance between M6 and M7 for voltage differences between the plus and minus inputs of OPN5 90. This current imbalance results in a voltage difference at the drains of M8 and M9 that is much larger than the original input voltage imbalance because of the large output impedance of the cascode current mirror.

Voltage gains of 70 dB are possible with the single stage amplifier configuration shown in FIG. 16, which is adequate for many switched-capacitor applications. The dominant pole of OPN5 90 occurs at the output node Vo when driving capacitive loads of 1 pF or greater. Therefore, the load capacitance also serves as frequency compensation with phase margin increasing with load capacitance. Two disadvantages of OPN5 90 are the large output impedance and the reduced output signal swing because of the series-connected transistors in the output leg. The large output impedance is acceptable for switched-capacitor applications because no resistive loads are driven. Although the reduced signal swing is a limitation, OPN5 90 provides adequate output signal swing capability for the sample-and-hold application on AVQ 10.

This single stage OPN5 90 was used in AVQ 10 application rather than the conventional 2-stage CMOS op-amp for several reasons. First, the 2-stage CMOS op-amp requires pole splitting frequency compensation to guarantee dominant pole behavior. This pole splitting reduces the frequency response and also increases the size and complexity of the op-amp. In addition, the second stage typically consumes a large portion of the total power of a 2-stage CMOS op-amp. Consequently, the size and power dissipation can be significantly reduced and higher operating frequencies achieved by using a single stage CMOS op-amp.

Since 16 total OPN5 circuits are used in AVQ 10, small size and low power consumption are desirable. High operating frequencies are also required for video applications. PSPICE simulations of the extracted OPN5 90 layout using typical parameters yielded a voltage gain of 68 dB, a unity-gain frequency of 12.6 MHz, and a phase margin of 46° for the nominal 2 pF load capacitance. The op-amp consumes 116 μA with 5 V supplies for a power dissipation of only 0.6 mW. The settling time of this op-amp to within 1% is approximately 240 ns for a 1 V input step, which limits the frequency of operation to approximately 2 MHz. Faster settling times are possible at the expense of increased power consumption.

3. PHGEN Circuit

Figure 17:
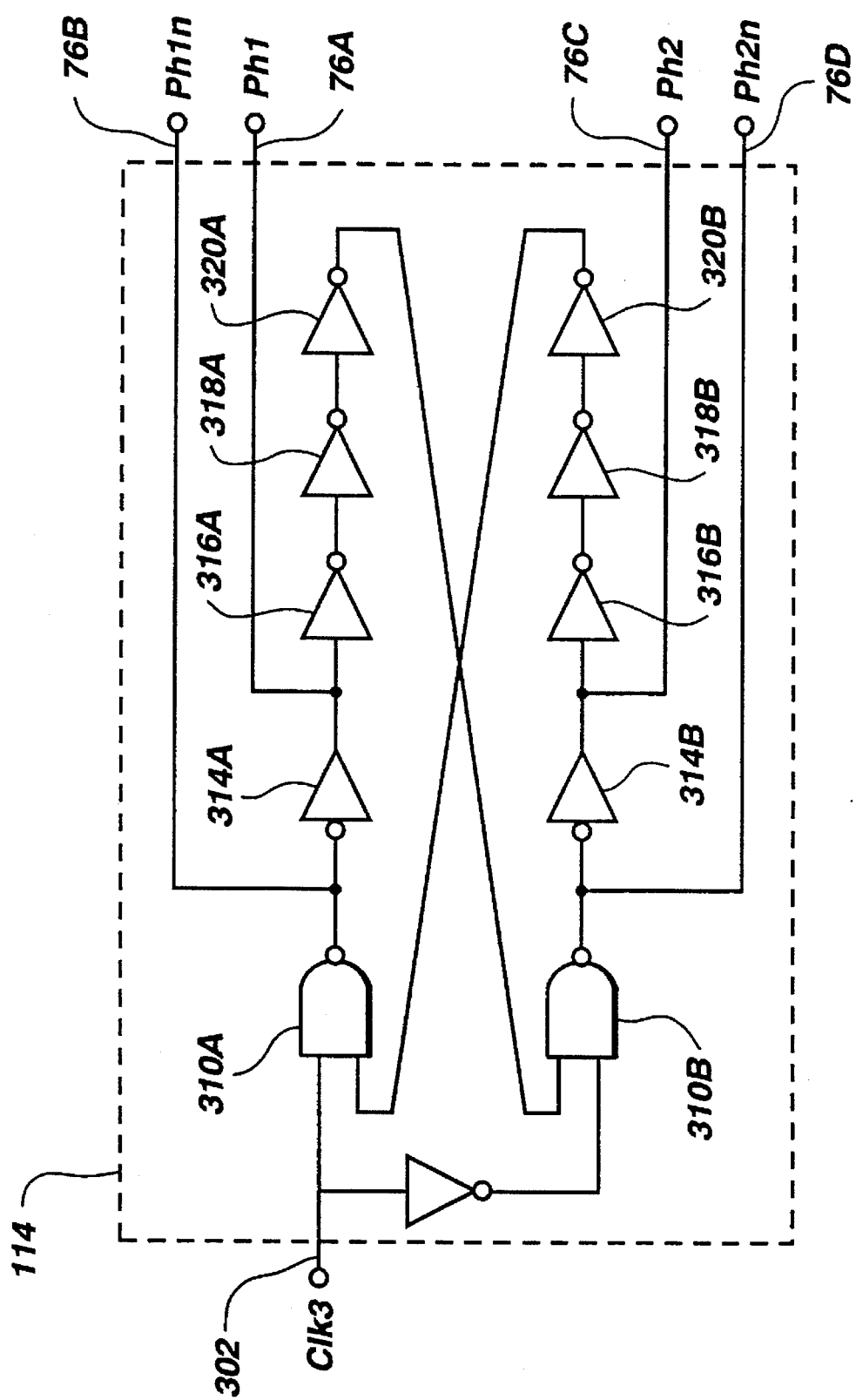
FIG. 17 is a schematic of a PHGEN 2-phase nonoverlapping timing generator circuit employed in the AVQ of FIG. 1.

Referring to FIG. 17, phase generator PHGEN circuit 114 receives signal Clk3 at an input 302 and provides signals Ph1, Ph1n, Ph2, and Ph2n are outputs 76A, 76B, 76C, and 76D, respectively. The purpose of PHGEN circuit 114 is explained as follows. Because switched-capacitor circuits rely on charge conservation, certain switches are turned off before others are turned on. Consequently, 2-phase nonoverlapping timing signals are used for controlling the switches in these circuits. As previously mentioned the switches are usually implemented with CMOS couplers, which require two opposite polarity signals for control. Therefore, both polarities of each phase of the 2-phase nonoverlapping timing signals are used. For example, in sample-and-hold circuit 44 shown in FIG. 4, the nonoverlapping timing signals Ph1 and Ph2 and their complements Ph1n and Ph2n are used to guarantee that the CMOS couplers driven by Ph1 and Ph1n are turned off before the couplers driven by Ph2 and Ph2n are turned on, and vice versa. The 2-phase nonoverlapping timing generator is one of the most important circuits for switched-capacitor circuits, as it guarantees nonoverlapping signals for a wide range of transistor parameters and capacitive loads.

PHGEN circuit 114 is the 2-phase nonoverlapping timing generator circuit used for AVQ 10. Ph1 is the output timing signal that is in phase with the Clk3 input, and Ph2 is the out-of-phase signal. Ph1n and Ph2n are the complements of Ph1 and Ph2, respectively. PHGEN circuit 114 is essentially a cross-coupled NAND latch including NAND gates 310A and 310B with additional inverters 314A and 314B, 316A and 316B, 318A and 318B, and 320A and 320B, and works as follows. The output of each cross-coupled NAND gate cannot switch from high to low until the associated cross-coupled input goes from low to high. Thus, the cross-coupled NAND gates prevent one phase from going low until the other phase has gone high, resulting in the timing signals used for driving the p-channel coupler transistors. Inverters 314A and 314B generate the opposite polarity timing signals Ph1 and Ph2 used for driving the n-channel transistors in sample and hold circuit 44.

NAND gates 310A and 310B and inverters 314A and 314B are designed to have typical switch points of (Vdd–Vss)/2, which results in approximately equal rise and fall times. However, the n- and p-channel coupler transistors can have threshold voltages as low as 0.5 V and –0.5 V, respectively. Thus, the coupler transistors can still be turned on at the switch point of NAND gates 310A and 310B for the typical 5.0 V difference between Vdd and Vss. As a result, additional inverters are used to guarantee nonoverlapping coupler behavior. Inverters 316A and 316B, 318A and 318B, and 320A and 320B in each leg of PHGEN circuit 114 are to guarantee that the Ph1 or Ph2 signals driving them have completely turned off the associated coupler before the cross-coupled NAND input is allowed to rise. For typical process parameters, inverters 316A, 316B, 320A, and 320B have switch points less than (Vdd–Vss)/2, meaning that their inputs are below (Vdd–Vss)/2 before their outputs will switch from low to high. Inverters 318A and 318B have typical switch points of (Vdd–Vss)/2. The lower switch point of inverters 316A, 316B, 320A, and 320B prevent signals with slow fall times, due to large capacitive loads, from turning on the next phase before the previous phase is completely turned off, even for large capacitive loads.

4. Standard Cells

The analog SCNA20 process currently offered by MOSIS was chosen to implement AVQ 10 because of the availability of poly2 to poly1 capacitor structures. This relatively new process offered by MOSIS had no standard cells available for use, including bonding pads. Consequently, a set of standard cells was developed by the inventor for the SCNA20 process. These standard cells include bonding pads and digital logic functions, both of which are discussed below.

a. Bonding Pads

Bonding pads are components in ICs that allow the ICs to interface with the outside world through, for example, pins. Bonding pads are usually developed by specialists. In CMOS, the input pads provide overvoltage protection for MOSFET gates and also inhibit latchup. In the SCNA20 process, the $S_iO_2$ gate oxide thickness is typically 400 Å, resulting in a breakdown strength of approximately 28 V. ICs are often subject to voltages exceeding 28 V during handling because of static charges, and so voltage clamping devices on the input pins are used to prevent the destruction of MOSFET gates. In addition, CMOS ICs are susceptible to a destructive mechanism referred to as latchup. Latchup occurs when parasitic SCR structures, which are present in all CMOS circuits, are triggered. Latchup cannot be eliminated in CMOS, but it can be inhibited. Diffusion guard rings are one of the most common techniques to inhibit latchup, and were incorporated in the input and output pads developed for AVQ 10.

Bonding pads assemblies 330, 332, and 334 for inputs and outputs and a Vdd and Vss pad were developed for AVQ 10.

Figure 18:
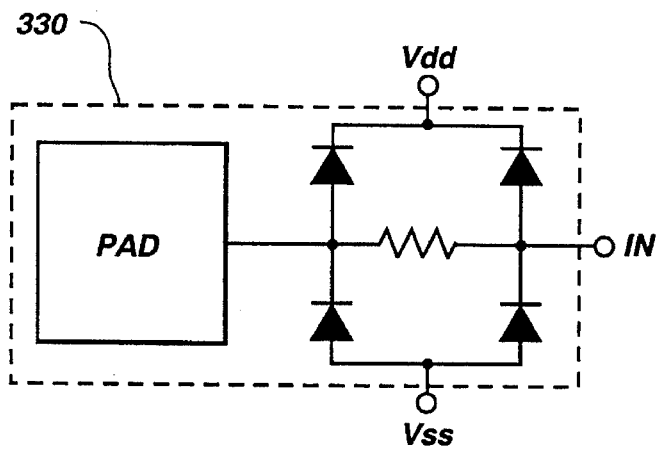
FIG. 18 is a schematic of an input pad used with the AVQ of FIG. 1.

Referring to FIG. 18, input bonding pad assembly 330 is used for both digital and analog inputs. The diodes to Vdd and Vss clamp the pad voltage to approximately 0.8 V above and below Vdd and Vss, respectively. The clamping diodes prevent overvoltage of the MOSFET gates and also reduce the chances of latchup by clamping large magnitude voltages at the pad. The n+ to p– substrate and p+ to n– well diodes available in n–well CMOS are utilized to implement the diodes. An n+diffusion resistor is also included for additional protection of MOSFET gates. Although not illustrated in FIG. 18, both n+ and p+guard rings are also included in the input pad to inhibit latchup.

Figure 19:
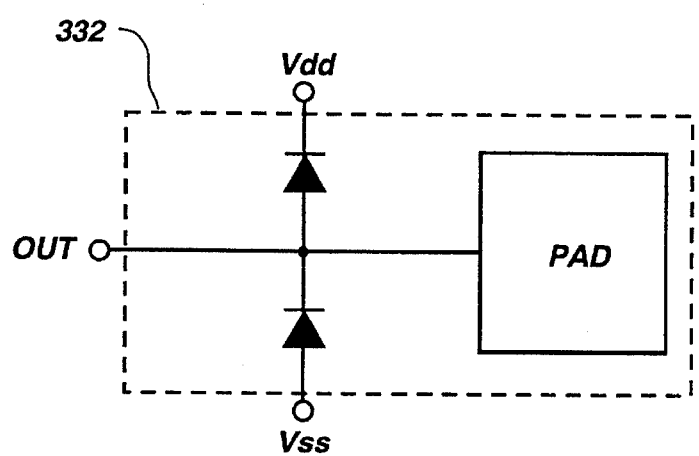
FIG. 19 is a schematic of an output pad used with the AVQ of FIG. 1.

Referring to FIG. 19, output bonding pad assembly 332 employs diode clamps to limit the input voltage, which reduces the chances of latchup. The diffusion resistor that was used in the input bonding pad assembly 330 is not necessary in the output bonding pad assembly 332 because the outputs are not connected to any MOSFET gates. Again both n+ and p+guard rings are included in output bonding pad assembly 332 to inhibit latchup.

Figure 20:
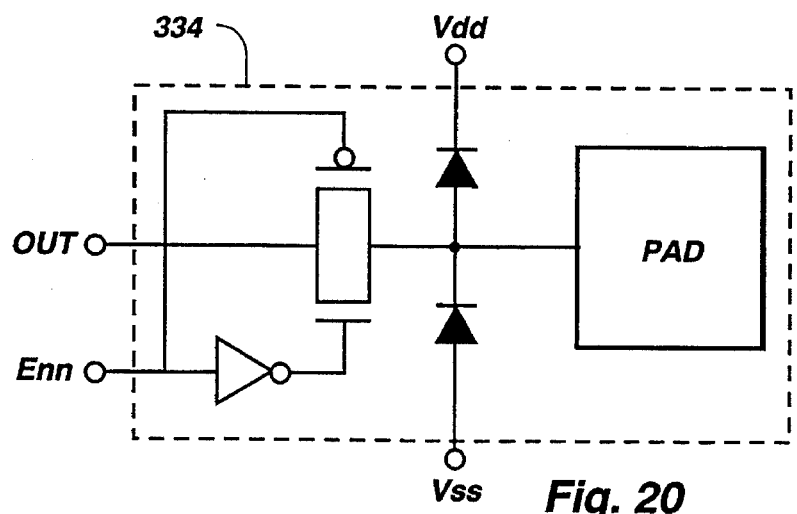
FIG. 20 is a schematic of a tri-state output pad used with the AVQ of FIG. 1.

Referring to FIG. 20, a tri-state output bonding pad assembly 334 is used with the tri-stated outputs of AVQ 10. The control signal Enable not (Enn) is an asserted low enable that controls the tri-stating of the output. When the asserted low signal Enn is asserted, the Out signal is connected to the output pad through the CMOS coupler, and the output pad is tri-stated for Enn not asserted. Diode clamping and diffusion guard rings are also included in the tri-state output pad.

Vdd and Vss pads were also developed for AVQ 10. These pads provide low resistance connections between the main Vdd and Vss buses and the external power pins. In addition, metal-2 thick field transistors were used to clamp the maximum voltage difference between Vdd and Vss to approximately 15 V. This clamping is to protect against the harmful effects caused by excessive drain-to-source voltages, such as threshold voltage shifts due to hot electron injection.

b. Digital Logic

In addition to the bonding pads, a set of standard digital logic cells was developed for use on the AVQ16. These digital cells were designed to have a common height of 95 m with metal-1 Vdd and Vss buses running parallel along the top and bottom of each cell. This standard cell layout style allows the cells to be butted together to form banks with common power buses. All signal inputs and outputs come out from both the top and bottom of the cells in metal-2 to allow interconnections between cell banks. A feedthrough cell was also designed to allow interconnections to be passed through cell banks. These digital logic cells were used to implement the timing generator circuit 218, BUF1 66, BUF2 214, and address ready circuit 222.

C. Analog Memory

A vector quantizer that computes distortions between analog voltages uses analog codevectors as inputs. Simply using commercially available digital-to-analog converters (DACs) to provide the analog codevectors is not practical for most applications because of the large number of DACs used. Consequently, some type of analog memory is desirable to make analog VQ encoding more practical.

1. Analog ROM

Figure 21:
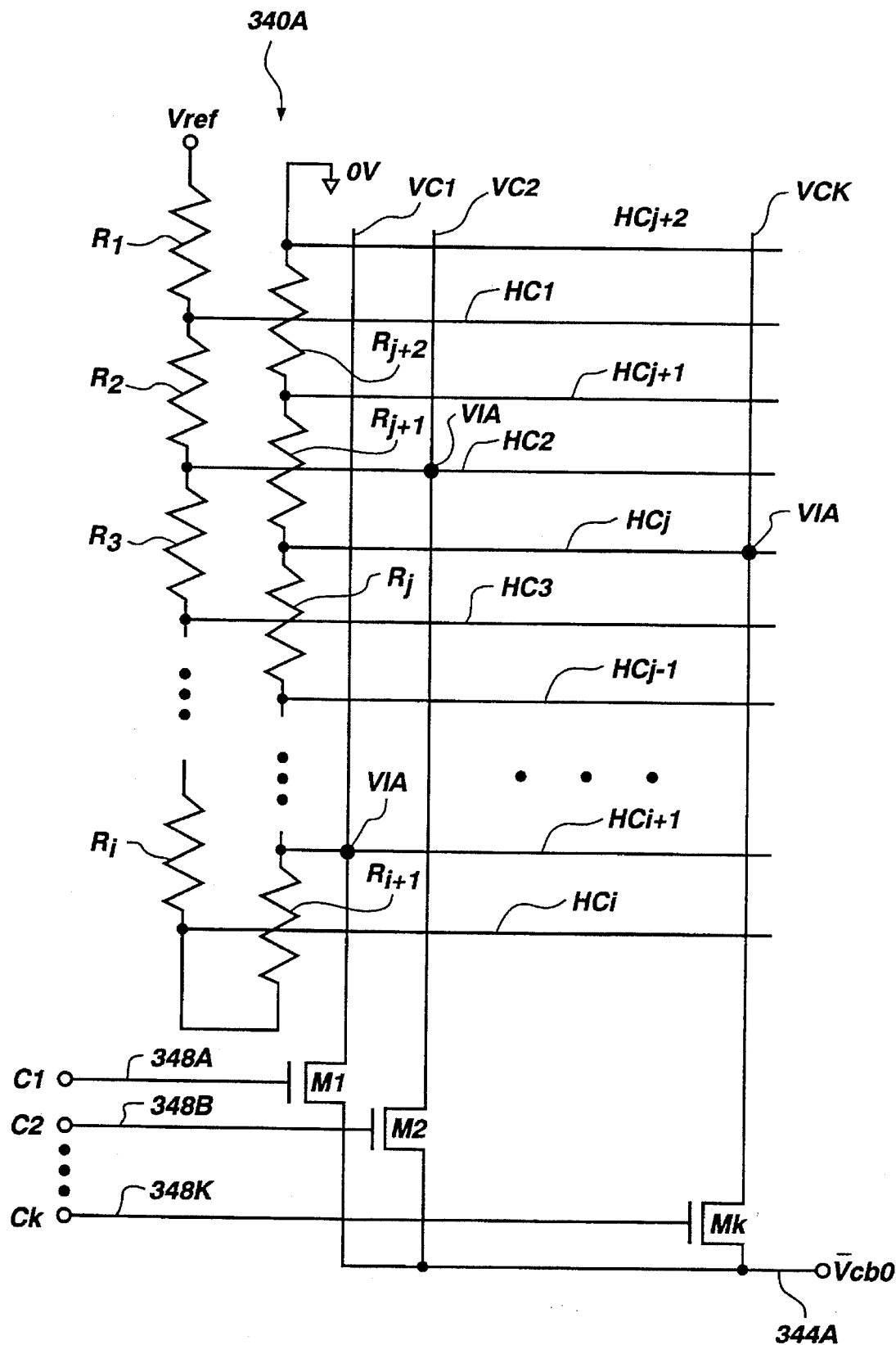
FIG. 21 is a schematic of a 16 component analog ROM contain codevectors for the AVQ of FIG. 1.

One approach to analog memory is an analog Read Only Memory (ROM) circuit developed by the inventor. This approach is suitable for fixed codebook applications. Referring to FIG. 21, an analog ROM 340A supplies the voltage components for vector $\overline{V}cb0$ on a conductor 344A, which is electrically connected to conductor 22A in FIG. 1. A ROM 340B (shown in FIG. 23 and analogous to ROM 340A) supplies vector $\overline{V}cb1$ on a conductor 344B, which is electrically connected to conductor 22B.

ROM 340A is essentially a programmable resistive divider and is capable of generating the k analog voltages used for codevectors of dimension k. This resistive divider approach does not require output buffering as long as only capacitive loads are driven, which is the case for AVQ 10.

ROM 340A includes resistors R1, R2, ..., Ri, Ri+1, Rj, Rj+1, Rj+2, and Rj+3 in a series divider network. The resistors preferably have the same, but may have different resistance values. The resistors may be implemented using the first polysilicon layer (poly1) in the SCNA20 process, and horizontal conductor lines HC1, HC2, HC3, ..., HCi, HCi+1, HCj−1, HCj, HCj+1, and HCj+2 connected between the resistors are in metal-1. Vertical metal-2 conductor lines VC1, VC2, ..., VCk overlap the metal-1 lines with a connection possible wherever a metal-2 to metal-1 interconnection via is included.

Programming includes placing a via in the appropriate location on each vertical metal-2 line to give the desired voltage from the resistive divider. For example, in FIG. 21, a via is placed between horizontal conductor line HCi+1 and vertical conductor line VC1. The magnitudes of the k components are flexible in that vias may be placed at any intersection. The voltage programmed onto each vertical metal-2 line corresponds to one component of the stored codevector. Each of the vertical metal-2 lines connects to one of the switching transistors M1, M2, ..., Mk, which switch the appropriate vertical line to the ROM output. Transistors M1, M2, ..., Mk, are controlled by control signals C1, C2, ..., Ck on conductors 348A, 348B, 348k, which are used to switch successive vector components to the output. Only one poly1 resistive divider network is needed to generate all k components of a given codevector, resulting in efficient analog storage.

The output voltage components Vcb0i of ROM 340A are provide in equation (12), below:

$$Vcb0i = (Mi/n)Vref \quad (12),$$

where Vref is shown in FIG. 21, n is the number of resistor segments in ROM 340A, and mi is the number of resistor segments between 0V and the particular associated via and is an integer ranging from 0 to (n−1). The via programming determines the integer m for each vertical line illustrated in ROM 340A. Equation (12) assumes the resistors each have the same resistance and that no current passes through conductor 344A. In the present case, once the capacitors in DMCs 18 are charged, essentially no current passes through conductor 344A.

The quantization errors resulting from ROM 340A decrease with an increase in the number of resistors, at the expense of silicon area. This analog ROM technique can reasonably provide up to eight bits of resolution. The output voltages of the resistive divider are guaranteed to be monotonic, and are not a function of temperature.

A 6-bit (64 resistors) version of ROM 340A was implemented on a test chip utilizing the SCNA20 process. This ROM 340A used 12 μm×12 μm poly1 resistors, and was found to perform as expected. The overall size of a 6-bit analog ROM is 220 μm×438 μm, for a vector dimension of 16. The ROM size would be 220 μm×663 μm for a 7-bit resolution, and 220 μm×1113 μm for an 8-bit resolution.

ROM 340A could be used to store the codevectors onboard AVQ 10. Referring to the block diagram in FIG. 13, which illustrates the physical layout of AVQ 10, ROMs 340A–340P cells could be added to the outside ends of each distortion measuring circuit in place of pins p-Vcb0–p-cb15. In that case, the associated codevector pads could be removed. As a result, fixed analog codevectors could be stored on chip, at the expense of the width increases provided in Table 3, which states width increases to AVQ 10 resulting from the addition of onboard codevectors of various resolutions stored in ROM 340A.

TABLE 3

| Resolution (bits) | Width Increase (μm) | Width Increase (Mils) |
|---|---|---|
| 6-bits | 536 | 21.1 |
| 7-bits | 986 | 38.8 |
| 8-bits | 1886 | 74.2 |
| 9-bits | 3686 | 145.1 |

Figure 23:
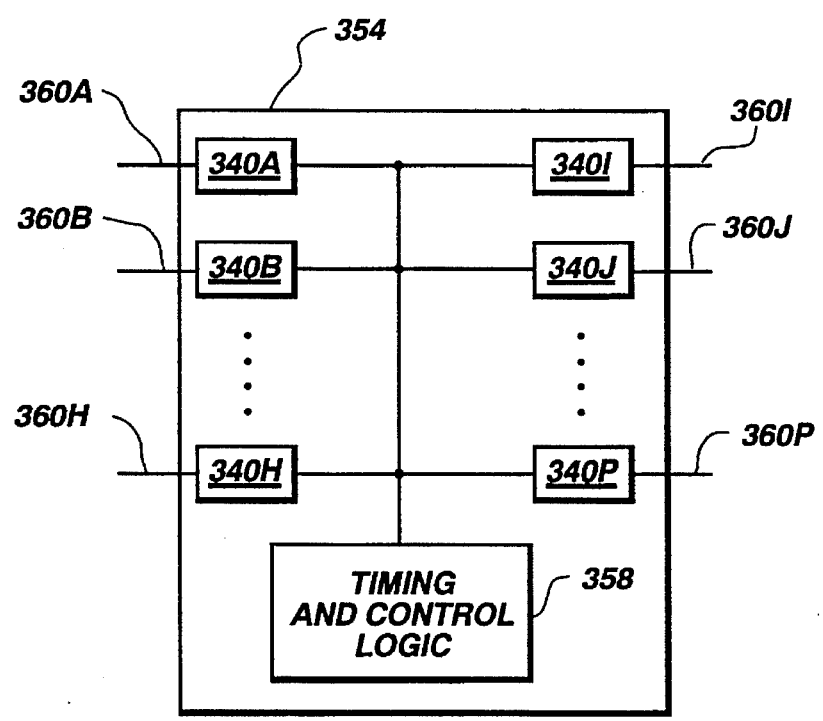
FIG. 23 is a schematic of a ROM chip containing multiple ROMs of the type in FIG. 21.

Referring to FIG. 23, a ROM chip 354 containing multiple ROMs 340A, 340B, ..., provides $\overline{V}cb0$–$\overline{V}cb15$ to AVQ 10 through conductors 360A, 360B, ..., 360P. Of course, the number of ROMs 340 could be much larger than 16. For example, the number could be 32, 64, 128, or 256, or some number greater than or between these numbers. ROM chip 354 includes timing and control logic 358 similar to timing generator circuit 218 in AVQ 10 to provide vector components at appropriate times.

ROM chip 354 may be internal to or external to AVQ 10. If ROM chip 354 is internal to AVQ 10, pads are not necessary and the circuit is faster and takes less power.

If ROM chip 354 is separate from AVQ 10, the user could have a various ROM chips 354, each for a different application. For example, one ROM chip 354 could be used for medical imaging, another ROM chip 354 could be used for other imaging, and still another ROM chip 354 could be used for pattern recognition. However, AVQ 10 is relatively inexpensive to manufacture so that the various chips could include both an AVQ 10 and an application specific ROM chip 354.

Figure 24:
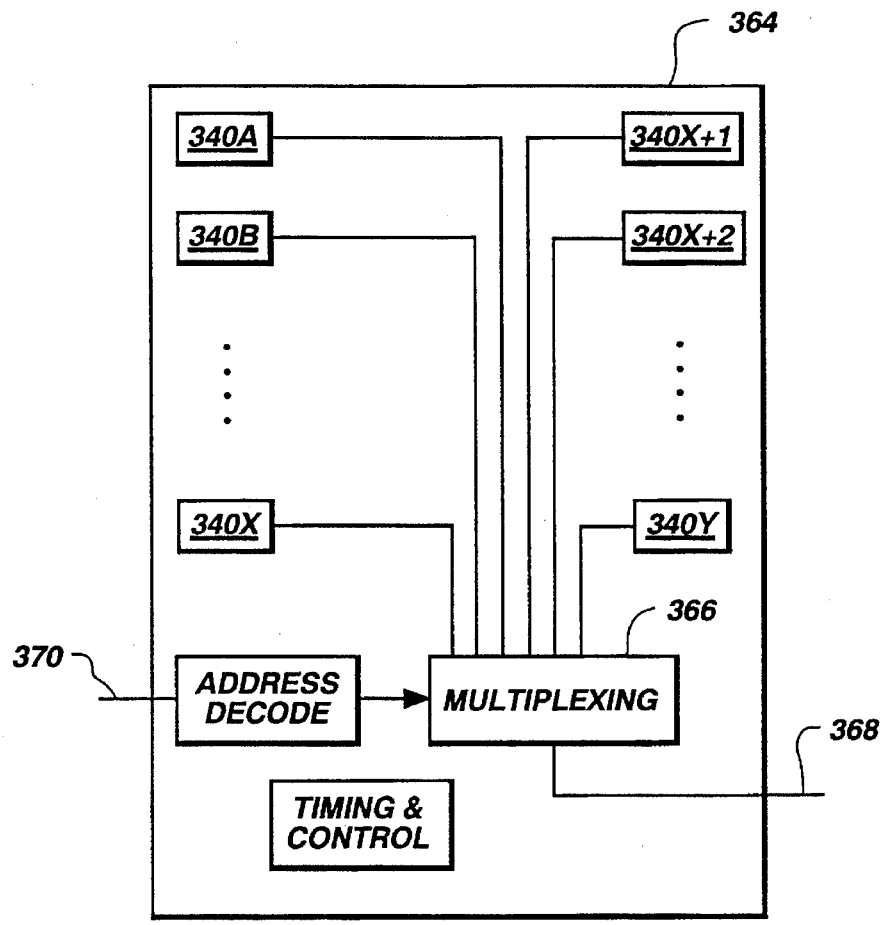
FIG. 24 is a schematic of a ROM chip that may be used for tree searching and contains multiple ROMs of the type in FIG. 21.

Referring to FIG. 24, a ROM chip 364 may be used in connection with AVQ 10 or another AVQ for tree search vector quantization. ROM chip 364 includes ROMs 340A–340Y which provide codevectors to multiplexing circuit 366. Multiplexing circuit 366 outputs the appropriate subset of the codevectors on conductors 368 to the AVQ. ROM chip 364 also includes an address decoder and a timing and control circuit. The address decoder receives signals on conductors 370 from the AVQ.

Still another approach is to have a ROM chip 354 (whether in a separate or the same VLSI chip as AVQ 10) that is electrically programmable. Such a chip is described in the next section.

2. Floating-Gate MOSFET

The following describes an alterable analog memory for VQ applications in which codebooks are frequently updated. Such a chip could be the same as in the ROM 340A shown in FIG. 21 except floating-gate MOSFETs or similar technology would take the place of the vias. The floating-gate MOSFETs or similar technology would be programmed as on-off switches.

Alterable analog memories have been research in connection with analog neural network applications. The main focus of the research has been on the floating-gate. MOSFET, which is the memory element used in digital Electrically Erasable Programmable Read Only Memory (EEPROM) technology. This type of memory element relies on the charge stored on an electrically isolated MOSFET gate by means of Fowler-Nordheim tunneling. Once charge has accumulated on the floating gate, it can remain there for years. Traditionally, EEPROM devices required special processing steps to form a thin tunneling oxide. However, recent studies have shown that EEPROM devices can be constructed utilizing a standard double polysilicon CMOS process such as the SCNA20 process used to implement AVQ 10.

Figure 22:
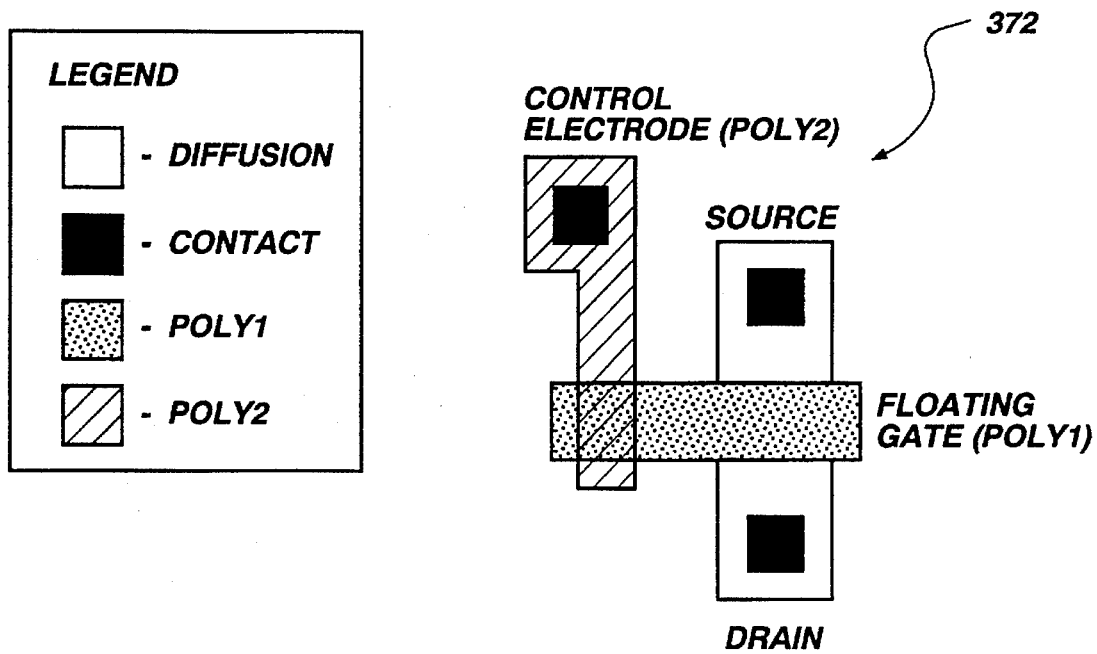
FIG. 22 is a top view of a floating-gate MOSFET where tunneling occurs between Poly1 and Poly2.

FIG. 22 illustrates a top view of a floating-gate MOSFET 372 utilizing a double polysilicon CMOS process. Electrons are tunneled to and from the floating poly1 gate under the control of the programming voltage applied to the poly2 electrode. The drain current through the floating-gate MOSFET depends upon the drain-to-source voltage, and the charge stored on the floating gate. Thus, the drain current is a programmable quantity that defines whether the transistor is on or off.

A combination of the analog ROM and floating-gate MOSFET may be a viable solution to alterable analog memory for VQ applications. Floating-gate MOSFETs could be programmed as on/off switches, as is done in digital EEPROMs, to replace the vias used in the ROM 340A shown in FIG. 21. This would provide an electrically alterable analog ROM.

As another alternative, the analog ROM could be programmed by means of fuseblowing techniques.

D. Measured Results of AVQ 10

1. Background

A conversion done by a uniform scalar quantizer, as in a standard analog-to-digital converter (ADC), is usually specified in terms of accuracy and resolution. By convention accuracy specifies the total error, although most would agree that this is inaccuracy. In the conventional sense relative accuracy is usually specified in terms of least significant bits (LSBs), or as a percent of full scale (FS), with smaller being better. The resolution r of a uniform scalar quantizer is defined in equation (13), below:

$$r = \log_2 N (bits) \tag{13}$$

where N is the total number of quantization levels. For a uniform scalar quantizer a least significant bit (LSB) is then FS/N, where FS is the full-scale voltage, and the worst-case quantizer error or uncertainty is $\pm(\frac{1}{2})$ LSB. Thus, the resolution of a uniform scalar quantizer is a useful parameter that specifies the size of an LSB, and hence the worst-case quantization error. For an ideal uniform scalar quantizer the relative accuracy is also $\pm(\frac{1}{2})$ LSB, as the quantization error is the only source of error.

For a vector quantizer the resolution r has been defined in equation (14), below:

$$r = (\log_2 N)/k (bits) \tag{14}$$

where N is the total number of codevectors and k is the vector dimension. Unlike a scalar ADC, the number of codevectors, or quantization levels, used with an analog vector quantizer is generally not fixed in hardware. Also the distribution of codevectors in the vector space is source dependent and rarely uniform for a vector quantizer. As a result, the resolution of a vector quantizer is not as meaningful of a performance parameter as it is for a uniform scalar quantizer. In addition, the worst-case quantization error tends to be too pessimistic of a measure for a vector quantizer because the worst-case will seldom occur for a well designed codebook. A statistical performance measure such as mean squared error is generally more appropriate than worst-case error for characterizing a vector quantizer. Therefore, for a given application a measure of the mean squared error would be a useful way to characterize a vector quantizer. However, a source independent performance measure of AVQ 10 is used in order to place a bound on the accuracy that is achievable with this chip. This accuracy measure should only include the errors introduced by AVQ 10 circuitry, and not quantization errors which are codebook dependent.

2. Accuracy of AVQ 10 Circuitry

In AVQ 10, each DMC 18 produces slightly different output voltages for identical inputs. As discussed in section A, above, this is mostly due to the offset voltage of COMP1 50 in absolute difference circuit 36, and to mismatches between capacitors. Referring to FIGS. 5 and 7, BMAG 30 also introduces offsets because of COMP1 voltage magnitude comparators 154, 156, and 158, resulting in further nonideal behavior of AVQ 10. For widely spaced codevectors this nonideal behavior is of no concern because the errors introduced by AVQ 10 hardware are negligible in comparison to the quantization errors introduced by the codevector spacing. However, as the codevector spacing is reduced, AVQ 10 hardware will eventually make errors in choosing the best codevector because of nonideal circuitry.

An error voltage $e_v$ is a measure of the total error per vector caused by AVQ 10 hardware. The error voltage $e_v$ can be determined by reducing the spacing between codevectors, as measured by the Euclidean distance, until the hardware no longer chooses the correct one. Thus, $e_v$ is a source independent measure of the accuracy of AVQ 10 hardware and gives a lower bound on the accuracy possible when using AVQ 10 in an analog-to-digital conversion application.

Ideally, $e_v$ should be measured for closely spaced codevectors over the entire vector space. However, for 16 component vectors this is an unreasonably large number of measurements. Fortunately, by considering the sources of error that contribute to $e_v$, the desired worst-case error can be found from measurements over a very limited region of the vector space. For closely spaced codevectors the error voltage $e_v$ is mainly due to comparator offset voltage and capacitor mismatch, as discussed in section A, above. The comparator offset voltage is bias dependent, which cause $e_v$ to depend upon input bias conditions. Consequently, $e_v$ should be measured over the desired input voltage range of AVQ 10. However, the error voltage per vector will be largest for some constant worst-case input voltage bias condition. As a result, each vector component can be made identical when measuring $e_v$, which greatly simplifies the measurement process. Thus, for closely spaced codevectors the worst-case error voltage $e_v$ can be found by considering equal vector components ranging over AVQ 10 input voltage range.

For equal vector components the vector error voltage $e_v$, as measured by the Euclidean distance, is in equation (15), below:

$$e_v = \left[ \sum_{i=1}^{k} e_c^2 \right]^{1/2} = \sqrt{k}\, e_c, \tag{15}$$

where k is the vector dimension and $e_c$ is the error per vector component. Thus, AVQ 10 cannot correctly resolve input vectors that are spaced closer than $e_v = 4e_c$, as measured by the Euclidean distance. The relative vector accuracy $r_v$ of AVQ 10 hardware is then given in equation (16), below:

$$r_v = \frac{\sqrt{k}\, e_c}{\sqrt{k}\, FS} \times 100 = \frac{e_c}{FS} \times 100, \tag{16}$$

where FS is the full-scale input voltage of the identical vector components. As given in equation (16), when all components of a vector are identical, the relative vector accuracy can be determined from $e_c$, which can be measured for AVQ 10 as follows:

1. Set the input vector and one chosen codevector equal.
2. Place the remaining 15 codevectors such that they are all identical to each other and are located a small distance away from the input vector in the vector space.

3. Perform a conversion with AVQ 10 and monitor the digital address output. Remember that the current address is for previous input vector.
4. If the digital output is correct, reduce the distance between the input vector and the other codevectors and repeat step 3.
5. Record the voltage difference between the identical vector components of the input vector and the 15 other codevectors that causes an incorrect digital output. This voltage is $e_c$ for the chosen input vector.
6. Repeat steps 2–5 with the remaining 15 codevectors placed such that they are again identical to each other, but are now located on the opposite side of the input vector in the vector space.
7. Repeat steps 1–6 while choosing each of the other 15 codevectors as the chosen codevector and record the worst-case $e_c$.
8. Repeat steps 1–7 for the desired common-mode input voltage values and record the worst-case $e_c$ for the given AVQ 10 chip.

The above procedure was implemented by providing constant voltages for the input vector and all codevectors, while a signal generator provided a continuous square wave clock signal to AVQ 10. A Fluke 8600A 4-½× digit multimeter was used to measure the voltage differences between the input vector and the 15 other codevectors. Light emitting diodes (LEDs) were used to monitor the digital address outputs of AVQ 10 under test. The error voltage $e_c$ was then measured by decreasing the voltage difference between the input vector and the 15 other codevectors until the LEDs just began to flicker, indicating errors in choosing of the best match codevector. This procedure was then repeated for all 16 codevector inputs over an input voltage range extending from (Vss+0.5) V to (Vdd−1.5) V.

Five different AVQ 10 parts were characterized in this fashion at common-mode voltages of 0.5 V, 1.5 V, 2.5 V, and 3.5 V for Agnd=3.50 V, Vdd=5.0 V, and Vss=0.0 V, and the worst-case measured $e_c$ was found to be 11.4 mV. The resulting relative accuracy of AVQ 10 is then [(11.4 mV)/(3.0 V)]×100=0.38%, which is equivalent to an 8-bit resolution. Thus, AVQ 10 hardware accuracy is comparable to 8-bit digital approaches.

3. AVQ 10 Data Compression System

In order to test data compression of the AVQ 10, an electronic hardware data compression system was developed to provide the analog input voltages to AVQ 10 and allow programmable control of AVQ 10 by means of an IBM-PC. In that electronic hardware data compression system, AVQ 10 received signals from voltage regulator circuits, voltage reference circuits, and 17 DACs. The 17 DACs received signals from the voltage regulator circuits and the voltage reference circuits. The 17 DACs received digital signals from a PC bus interface through an optical interface. The optical interface also received signals from a digital interface and AVQ 10. The AVQ 10 received signals from the optical interface. The digital interface interacted with the PC bus interface.

This electronic hardware data compression system is not further discussed in that it was only a test system (which is outside the scope of the present invention) and not the preferred way of using AVQ 10. Preferably, AVQ 10 receives analog signals directly from the source.

E. Analog VLSI Implementations

As previously discussed, it is desired to implement AVQ 10 in VLSI. AVQ 10 has a separate DMC 18 for each codevector input, followed by circuitry to determine the minimum distortion from among all of the matched distortion measuring circuits. The accuracy of an analog-to-digital conversion done by an AVQ 10 is limited by the accuracy of the VLSI circuitry. A hardware accuracy that is at least as good as an 8-bit digital approach was desired for AVQ 10. Thus, the separate distortion measuring circuits should be matched to within 8 bits of resolution.

1. Background

CMOS technology is currently preferred for the VLSI implementation, as both digital and analog functions can be easily integrated on a single chip. The possible approaches in CMOS to implement the analog portion of an analog vector quantizer chip include switched-capacitor circuits, switched-current circuits, and neural networks. The accuracy of all of these approaches is limited by mismatch between devices. Both switched-current circuits and neural network circuits rely on the matching of MOS transistors, while switched-capacitor circuits rely on the matching of interlayer capacitors.

Mismatch between MOS transistors occurs because of random variations introduced during processing, and thermal gradients. MOS transistor matching improves with increasing gate area because of averaging of the local processing variations. Therefore, MOS transistor mismatch can be reduced by increasing transistor sizes. However, thermal gradients between separate circuits on VLSI chips are very difficult to avoid. As a result, the MOS transistor matching between the separate distortion measuring circuits used in connection with an AVQ chip would be poor due to thermal gradients. For example, a 1 C change in temperature can result in a 0.4% change in drain current for an identical MOS transistor, which is slightly less than 8 bits of resolution. Thus, the accuracy achievable when utilizing switched-current circuits and neural network circuits to implement an AVQ chip is severely limited by thermal gradients.

Mismatch between interlayer capacitors in VLSI also occurs because of random variations that occur during processing, and can be minimized by increasing capacitor area. Linear capacitors in a conventional digital process require large areas because of the relatively thick oxides between layers. Consequently, an additional polysilicon layer is typically added to a standard CMOS process to implement the linear capacitors used in analog switched-capacitor circuits. The resulting poly2 to poly1 capacitors have excellent electrical characteristics, including negligible temperature dependence. Thus, a switched-capacitor approach has inherently better accuracy as compared to the switched-current or neural network approaches for an AVQ chip because the capacitance values are insensitive to thermal gradients. An AVQ chip using switched-capacitor circuits was developed by utilizing the 2-μm double polysilicon, double metal, SCNA20 process currently offered by MOSIS. This AVQ chip is more accurate than the other two approaches to AVQ known to the inventor and mentioned above in the background section.

3. Switched-Capacitor Circuit Limitations

Capacitors have been used rather than resistors in MOS analog VLSI because they can be matched better and are also more easily driven by MOS amplifiers. Switched-capacitor circuits employ charge transferring techniques by means of operational amplifiers, MOS transistor switches, and linear interlayer capacitors. The resulting transfer functions are proportional to capacitor ratios, which can be precisely controlled in VLSI. The accuracy of switched-capacitor circuits is mainly limited by mismatch between capacitors and switch-induced error voltages, both of which are discussed in detail in the following sections.

a. Capacitor Mismatch

Matching between devices on the same chip is ultimately limited by random variations that occur during processing. Interlayer capacitors can be matched to within 0.1% in VSI if careful layout techniques are used. Careful layout techniques include building all capacitors to be matched from identical unit capacitors, and using common centroid geometries whenever possible. A capacitor layout utilizing unit capacitors and a common centroid geometry is shown in FIG. 26.

Figure 26:
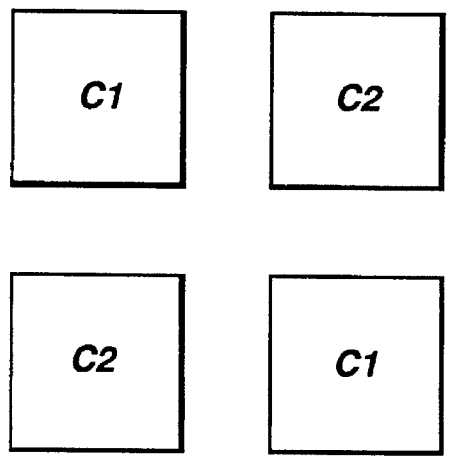
FIG. 26 shows unit capacitors arranged in a common centroid geometry.

Referring to FIG. 26, the figure capacitors C1 and C2, each includes two unit capacitors, which are located around a common center or centroid. Any mismatches between C1 and C2 caused by linear gradients in the capacitor dielectric are canceled by the common centroid geometry. When common centroid geometries are not possible, matched devices should simply be placed as close together as possible to minimize spatial fluctuations.

b. Switch-induced Error Voltages

Figure 27:
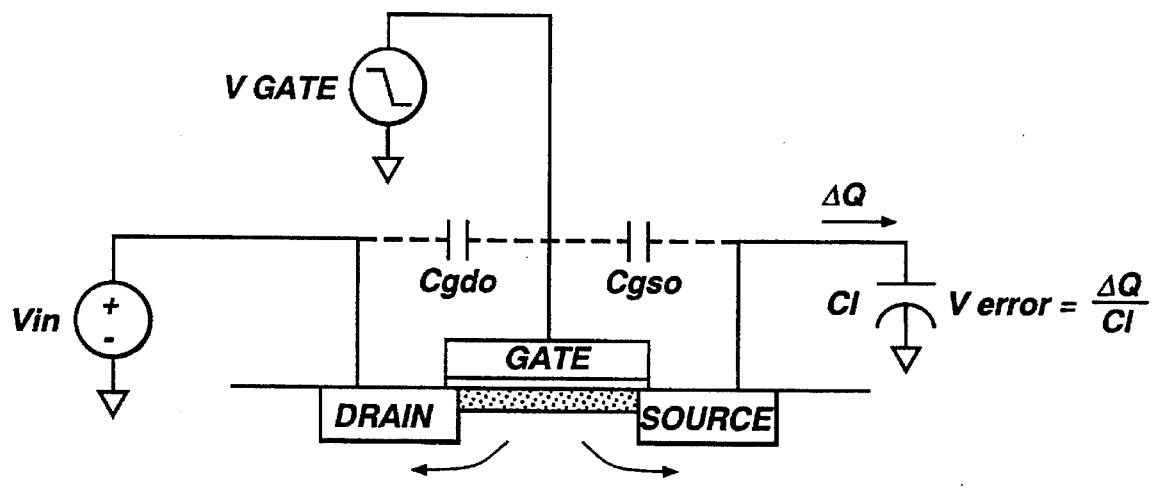
FIG. 27 is a cross-sectional illustration of an n-channel MOS transistor switch with a switch-induced error voltage.

The nonideal characteristics of MOS transistor switches also limit the performance of switched-capacitor circuits. FIG. 27 represents the cross section of an n-channel MOS transistor switch used to charge capacitor C1. The capacitors Cgdo and Cgso represent the gate-to-drain overlap and source-to-drain overlap capacitances of the MOS transistor. When Vgate is high, a conducting channel is formed under the gate of the n-channel MOS transistor, causing the switch to be closed. With the switch closed the voltage across C1 approaches Vin after sufficient charging time. When Vgate goes low to open the MOS transistor switch, an error charge is induced on C1 as illustrated in the figure. This switch-induced error charge comes from the charge stored in the conducting channel of the MOS transistor and from capacitive feedthrough of Vgate through Cgso.

Switch-induced error voltages have been analyzed by several authors. The results indicate that when the gate voltage falls rapidly approximately half of the stored channel charge flows to the source terminal, and half to the drain terminal of the MOS transistor. When the gate voltage falls slowly, the amount of stored channel charge flowing to the source terminal depends upon several parameters, making calculations more difficult. Also the amount of stored channel charge in a MOS transistor decreases linearly with decreasing gate-to-source voltage for gate-to-source voltages greater than the threshold voltage of the device. This causes the switch-induced error voltage to decrease linearly with increasing source voltage because of a reduction in the gate-to-source voltage.

When sizing MOS transistor switches for switched-capacitor circuits, both the capacitor charging time and the resulting switch-induced error voltage is considered. The charging time is determined by the resistance of the MOS transistor switch, which is minimized by choosing the shortest possible gate length. Increasing transistor widths also reduces the resistance of the MOS transistor switch. However, both the gate-to-source overlap capacitance and the amount of channel charge increase with increasing transistor width. Consequently, the width of the MOS switching transistors is chosen based on a compromise between the charging time and switch-induced error voltage. Switch-induced error voltages become more of a problem in high frequency switched-capacitor circuits because wider transistor sizes are needed to reduce charging times. Often parallel connected n and p-channel MOS transistors are used as switches in CMOS and are referred to as couplers. CMOS couplers provide better digital logic levels than single transistor switches, but require complementary gate voltage signals. Normally one gate voltage signal leads the other slightly, causing one of the coupler transistors to turn off before the other. The resulting switch-induced error voltage is then approximately equal to the switch-induced error voltage of the last transistor to turn off in the coupler.

Switch-induced errors are one of the main factors limiting the performance of switched-capacitor circuits, and can be reduced by minimizing the gate area of the switching transistors. Although switch-induced errors can be significant, the matching between switch-induced errors from identical transistors is on the order of 1%. In switched-capacitor circuits, switch-induced error voltages are a fairly small percentage of the full-scale voltage. As a result, mismatches in switch-induced errors are a very small percentage of the full-scale voltage, and can be neglected for most applications.

F. AVQ Applications

Vector quantization has traditionally been used for data compression of data that have already been digitized by a uniform scalar quantizer. The present invention includes using vector quantization as a method of directly converting from analog-to-digital form. Analog vector quantization offers improved coding efficiency as compared to conventional scalar ADCs for most practical sources, at the expense of increased encoding and decoding complexity. A novel VLSI implementation of an analog vector quantizer utilizing switched-capacitor techniques has been developed to perform analog-to-digital conversions. An analog ROM technique has also been developed that allows analog codevectors to be efficiently stored in VLSI.

Thermal gradients limit the transistor matching that is achievable between separate circuits on VLSI chips. The switched-capacitor approach in the present invention is insensitive to thermal gradients, and thus provides better accuracy than hardware approaches that rely on transistor matching. This switched-capacitor approach provides a relative accuracy that is equivalent to an 8-bit digital approach, which is better than the accuracy achievable using the other two approaches to AVQ known to the inventor and mentioned above in the background section. The accuracy of this switched-capacitor approach is mainly limited by comparator offset voltage and capacitor mismatch. Comparators that are smaller, faster, and have much lower offset voltage than the ones used on AVQ 10 have recently been reported in B. Razavi et al., "Design Techniques for High-speed, High-resolution Comparators," *IEEE Journal of Solid-State Circuits*, vol. 27, no. 12, pp. 1916–1926, December 1992. Use of these comparator circuits should increase both the speed and accuracy of an analog vector quantizer approach presented in this disclosure, at the expense of increased power dissipation.

Figure 25:
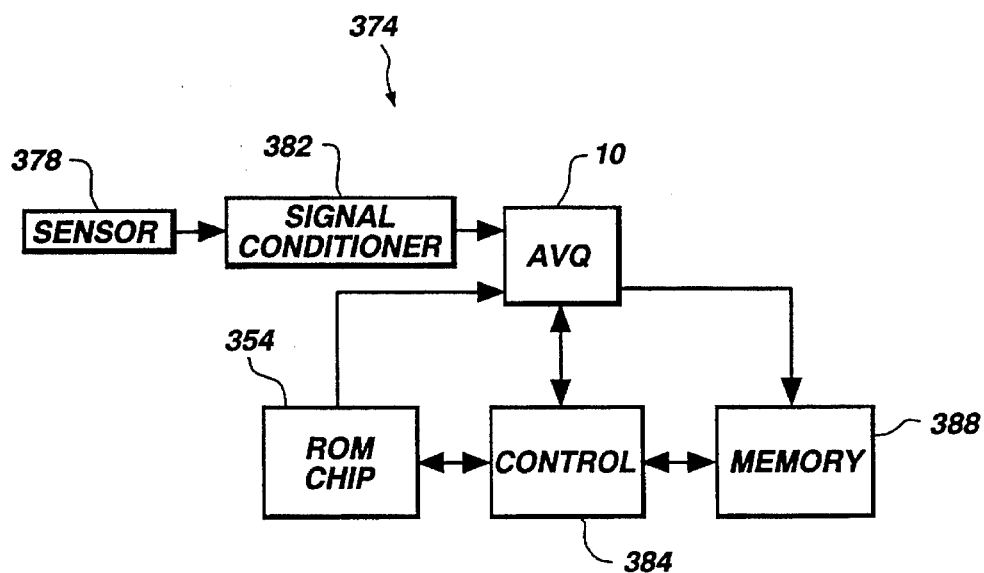
FIG. 25 is block diagram of an AVQ system in which the AVQ of FIG. 1 may function.

Referring to FIG. 25, a AVQ system 374 is one system in which AVQ 10 may function. AVQ 10 receives an analog Vinput signal from a sensor 378 and signal conditioner 382. ROMs 340A–340P could be internal to AVQ 10 or external to AVQ 10 in ROM chip 354. AVQ 10 is controlled by control circuitry 384 and supplies code vectors addresses to a memory 388.

AVQ 10 may be used to perform an analog-to-digital conversion on a variety of sources. Vector quantization is well suited for sources that have nonuniform probability distribution functions (pdfs) and/or dependencies between samples. In such applications, the flexibility in codevector location offered by vector quantization can provide more efficient coding as compared to scalar quantization. Two examples of applications that benefit from this flexibility are data compression and pattern recognition, discussed below.

1. Data Compression

Vector quantization has primarily been used as a data compression technique. Direct full-search VQ, which was discussed in the state-of-the-art section, above, is conceptually the simplest approach to data compression by means of vector quantization. However, implementations of direct full-search VQ are limited by the number of codevectors that can be reasonably processed. Analog approaches to VQ are more suited for direct full-search VQ than are digital approaches because of the potential for many more codevectors to be processed by a single chip. Size estimates for the analog VQ (AVQ) method presented in this disclosure indicate that a single VLSI chip is capable of storing and processing 128 codevectors. Consequently, a direct full search of a codebook with $2^7=128$ codevectors can be done with a single AVQ chip. For direct full-search VQ applications requiring codebooks larger than this, a multiple-AVQ system 400 shown in FIG. 28 may be utilized.

Figure 28:
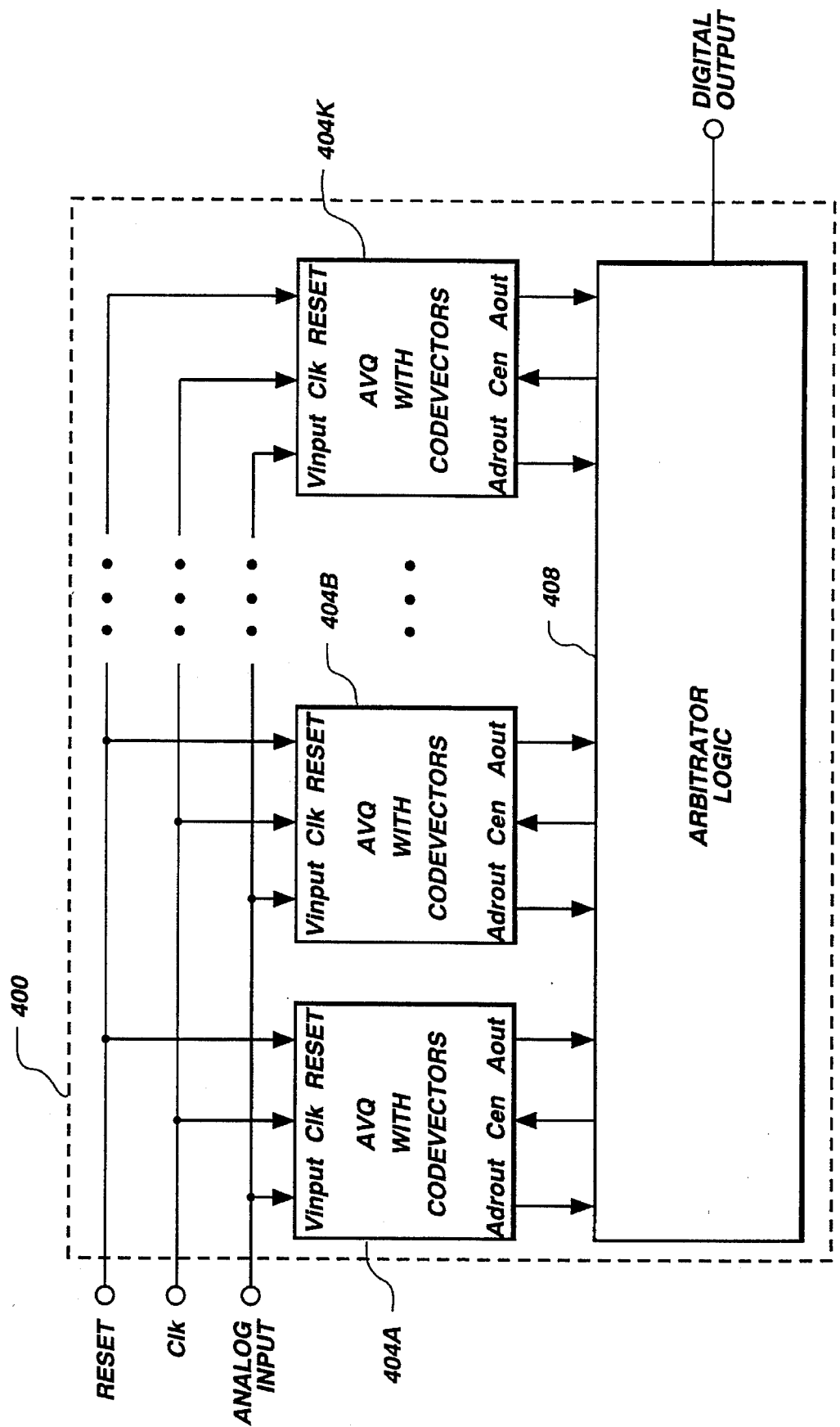
FIG. 28 is a block diagram of a full-search analog vector quantizer for large codebooks.

Referring to FIG. 28, multiple-AVQ system 400 includes AVQs 404A, 404B, . . . , 404k, where k depends on the number of codevectors and where AVQs 404A, 404B, . . . , 404k, are each an AVQ chip with on board codevectors. For example, for AVQs 404A, 404B, . . . , 404k capable of processing 128 codevectors each, a codebook including $2^{11}=$ 2048 codevectors could be processed using 16 AVQ chips in multiple-AVQ system 400. In that case, k=16 and 404k is 404P. AVQs 404A, 404B, . . . , 404k are connected through Aout, Adrout, and Cen signals to an arbitrator logic circuit 408. Arbitrator logic circuit 408 includes a best match and address generation circuit (BMAG), along with additional logic to generate the chip enable and analog output enable signals for AVQs 404A, 404B, . . . , 404k. Arbitrator logic circuit 408 could include a microprocessor and/or circuitry equivalent to that described above in connection with the BMAG 30. Arbitrator logic circuit 408 could be implemented in VLSI for full-search applications requiring many AVQ circuits. Thus, analog vector quantization provides a way to implement full-search VQ with a variety of sizes of codebooks.

As mentioned in the state-of-the-art section, above, techniques such as tree-search VQ are often used rather than direct full-search VQ to reduce the number of codevectors that are processed. In tree-search VQ the tree-structured codebook is traversed one level at a time. Thus, each input vector is stored to be available for use multiple times to perform this multi-level codebook processing. This means that additional sampling and storage hardware is used to implement tree-search VQ in real time on an input source. For example, two separate banks of k sample-and-hold circuits, where k is the vector dimension, are required to encode an analog input waveform in real time using tree-search VQ. The input waveform would be sampled consecutively by a bank of k sample-and-hold circuits. When an entire vector of input samples was acquired, the remaining bank of k sample-and-holds would sample-and-hold the resulting vector for tree-search processing. This would allow the input bank to begin acquiring the next sample vector while tree-search encoding is occurring on the previous vector. Consequently, 2k sample-and-hold circuits along with timing logic are used to implement tree-search VQ in real time on an analog input waveform. Digital approaches to VQ benefit more from tree-search VQ than analog approaches because digital storage is easier to implement.

Figure 29:
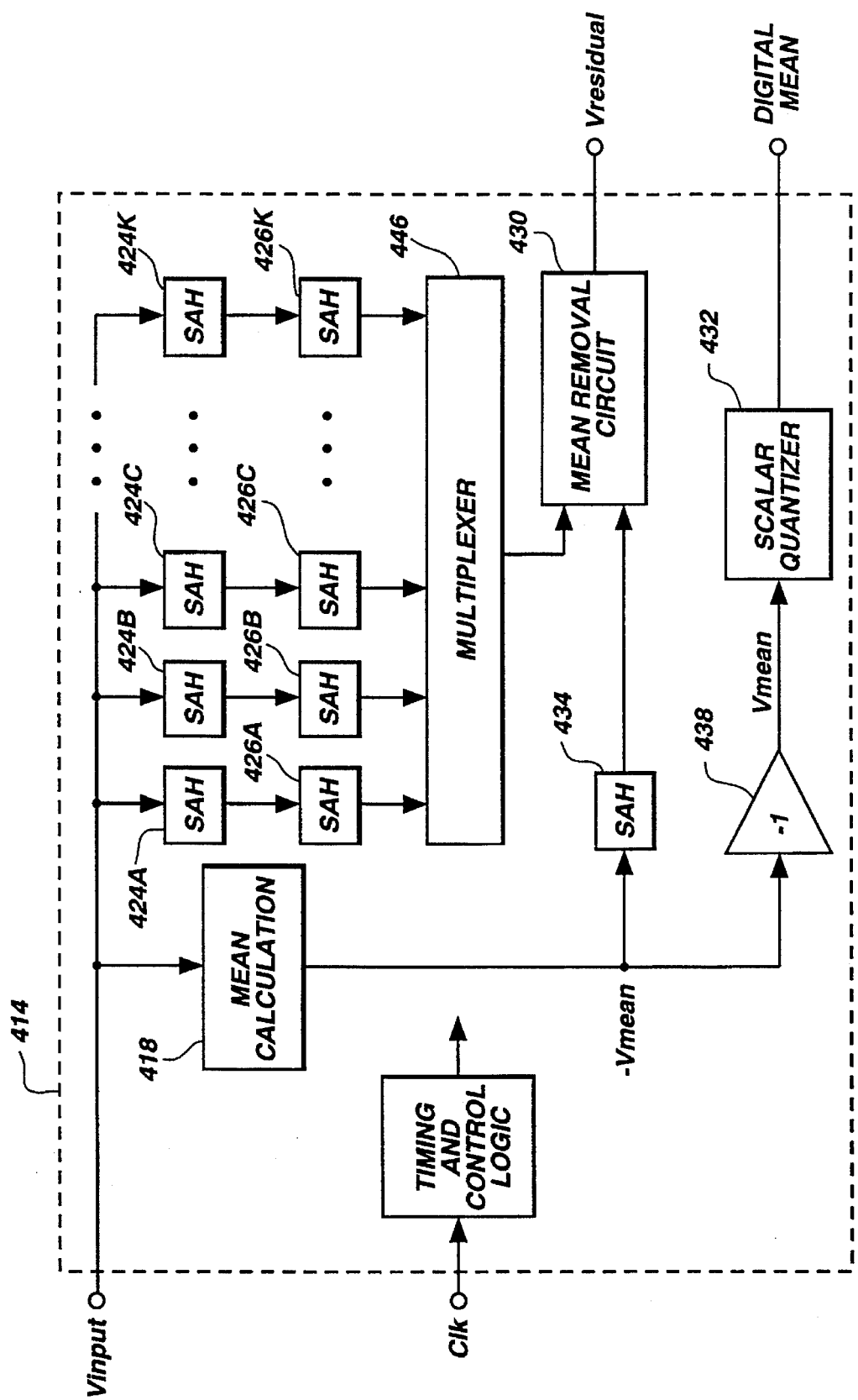
FIG. 29 is block diagram of an analog mean removal circuit.

As mentioned in the state-of-the-art section above, mean-removed VQ (MRVQ) can reduce the number of codevectors required as compared to direct VQ. Referring to FIG. 29, an analog mean-removal circuit 414 works as follows. A mean calculation circuit 418 computes the mean of k input samples, where k is the vector dimension. Two banks of sample-and-hold (SAH) circuits 424A, 424B, . . . , 424k and 426A, 426B, . . . , 426k connected to the $\overline{\text{Vinput}}$ line are sample and store input samples for use after the mean has been calculated. Once the vector mean is available, it is sampled and held for use by the mean removal circuit 430 and scalar quantizer 432, so that computation of the next vector mean can begin. The output of mean calculation circuit 418 is −Vmean so that a summer circuit can be used to remove the mean. Sample-and-hold circuit 434 in FIG. 29 can be the same as sample-and-hold circuit 44 in FIG. 4. An inverting sample-and-hold circuit 438 generates Vmean for scalar quantizer 432, and can be accomplished by simply changing the clock phasing of noninverting sample-and-hold 44 (as shown in FIG. 4). A multiplexer 446 and mean removal circuit 430 are used to subtract the associated mean from each vector component. The resulting residual vector is then available as input to an AVQ chip. Several possibilities, including switched-capacitor techniques, exist for the implementation of the scalar quantizer 432. The implementation chosen depends upon the resolution required and conversion time allowed.

Figure 30:
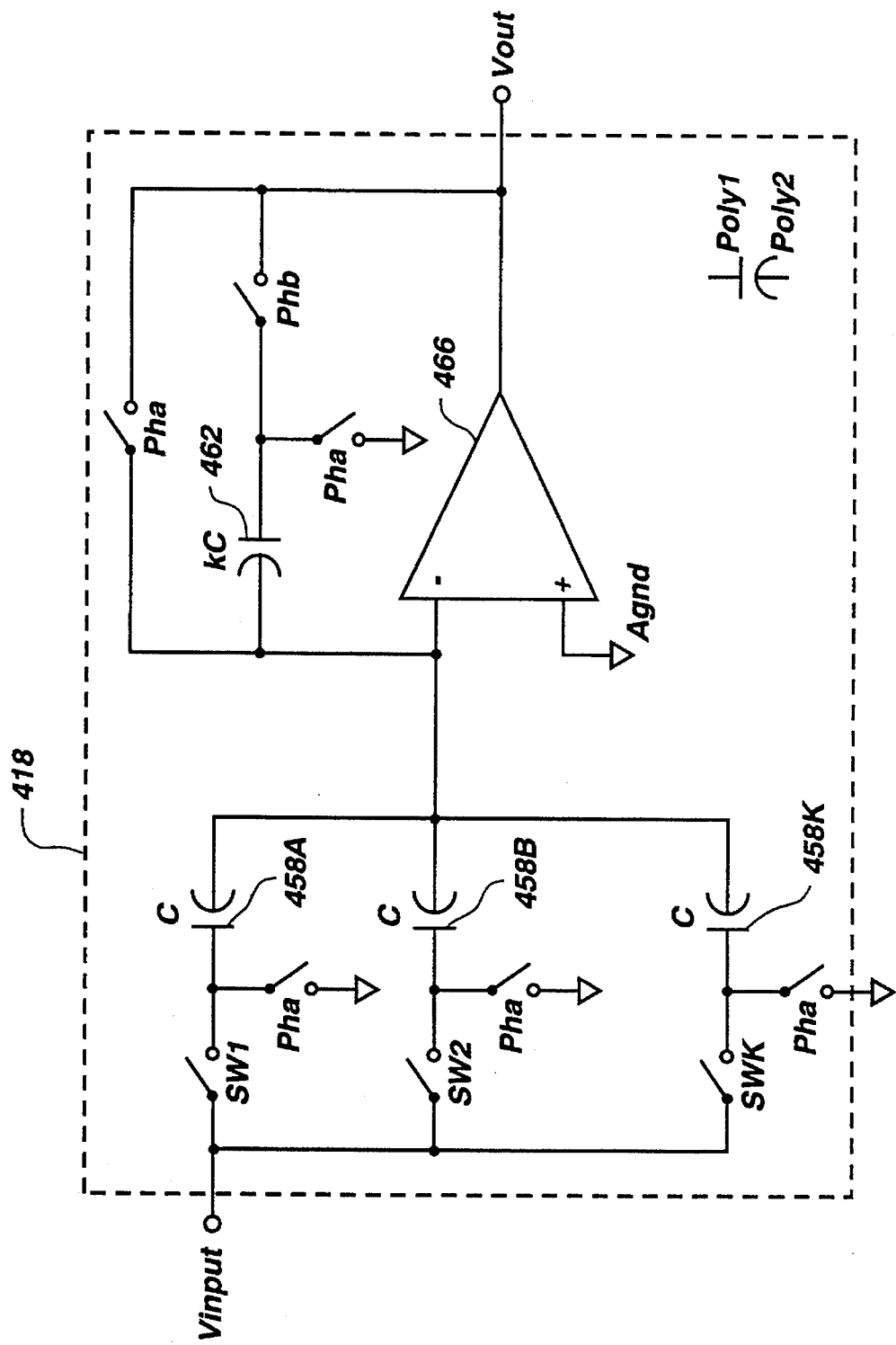
FIG. 30 is a schematic of a switched-capacitor circuit to calculate the sample mean of a vector.

Referring to FIG. 30, a switched-capacitor circuit 418 computes the sample mean of a vector. Switches Sw1, Sw2, . . . , Swk, and switches SwPha and SwPhb may be CMOS couplers. Each of input capacitors 458A, 458B, . . . , 458k has capacitance C and a feedback capacitor 462 has capacitance kc, where k is the vector dimension. Switched-capacitor circuit 418 is very similar to sample-and-hold circuit 44 shown in FIG. 4 and works as follows. The offset voltage of an op-amp 466 is stored on each of input capacitors 458A, 458B, . . . , 458k and feedback capacitor 462 during the reset phase Pha (i.e., when switches SwPha are closed). Then, during phase Phb (i.e., when switches SwPhb is closed), each of switches Sw1–Swk are closed to gather consecutive samples of the input voltage Vin. Neglecting charge injection, the total charge on the feedback capacitor after the last input sample has been gathered during Phb is given in equation (17), below:

$$Q_f = \left[ \sum_{i=1}^{k} (\text{Vinput}_i \mp \text{Vos})C \right] \pm \text{Vos}(kC), \quad (17)$$

where k is the vector dimension and Vos is the offset voltage. The opposite polarities on the Vos terms in equation (18) result in cancellation of the op-amp offset voltage Vos for switched-capacitor circuit 418. It is also insensitive to stray capacitances. The output voltage Vout at the end of Phb is then given in equation (18), below:

$$\text{Vout} = \frac{-Q_f}{kC} = \left[ -\frac{1}{kC} \sum_{i=1}^{k} (\text{Vinput}_i \mp \text{Vos})C \right] \mp \text{Vos}, \quad (18)$$

which reduces as shown in equation (19), below:

$$\text{Vout} = -\frac{1}{k} \sum_{i=1}^{k} \text{Vinput}_i = -\text{Vmean}. \quad (19)$$

Thus, switched capacitor circuit 414 provides a simple way to compute the sample mean of a vector. The main source of error in this circuit is charge injection, which can be minimized by carefully choosing coupler sizes.

Figure 31:
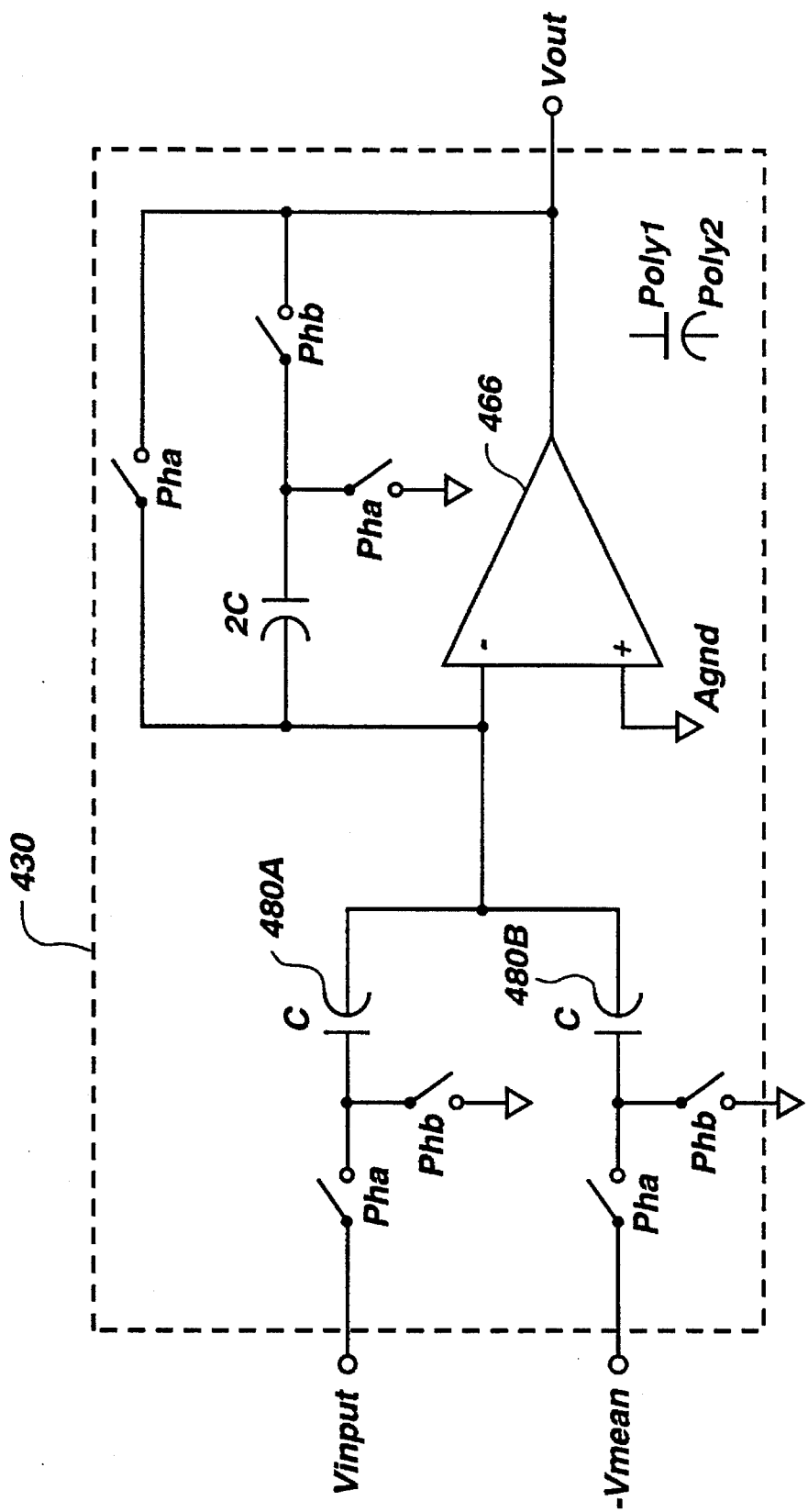
FIG. 31 is a schematic of a switched-capacitor circuit to remove the sample mean from a vector.

Referring to FIG. 31, a switched-capacitor circuit 430 performs mean removal of the stored vector components. Switched-capacitor circuit 430 is a summer circuit and so -Vmean is used as an input. Switched-capacitor circuit 430 is very similar to mean calculation circuit 418 in FIG. 29, except that the clock phase on switches connecting input capacitors 480A and 480B to analog ground have been changed, which causes the output to be noninverting. The output voltage of this circuit is then $\overline{\text{Vresidual}}=$ $\overline{V}$input–Vmean, which is the mean removed input vector for an AVQ chip.

The MRVQ circuit shown in FIG. 29 could be added as part of an analog vector quantizer chip, or could result in a separate analog MRVQ chip. The large full-search capabilities of analog VQ hardware along with MRVQ provide a very efficient way to implement vector quantization hardware.

2. Pattern Recognition

In vector quantization an input vector or pattern is compared against a set of stored patterns referred to as a codebook, and the best match selected. Therefore, vector quantization can also be viewed as pattern recognition. For example, the codevectors could each include different characters in a character recognition system, and the input vector matched to the closest character. Such systems would provide inherent noise tolerance for widely spaced codevectors. Thus, both digital and analog vector quantizers provide tangible ways of implementing pattern recognition systems in hardware.

G. Variations

Analog implementations for other VQ methods besides direct full-search VQ and MRVQ may be employed.

AVQ 10 also may utilize npn bipolar transistors available in the SCNA20 process. The performance of comparators and other circuits may benefit from BiCMOS circuit approaches.

Also as mentioned in section E, above, the full-scale input voltage range of AVQ 10 is currently limited by the 5 V process used. A 12 V analog process from Gould/AMI is being qualified by MOSIS, and should be currently available. This higher voltage analog process would be a good choice for future analog vector quantization hardware if extended supply operation is desired.

Those having skill in the art will appreciate that many changes may be made to the details of the above-described embodiment without departing from the underlying principles thereof.

For example, the building blocks of AVQ 10 and, indeed AVQ 10 itself, are described in great detail. The purpose of that detail is to advance vector quantization technology. By providing such detail, it is not suggested that the described circuitry is the only means of accomplishing the invention. Rather, it is apparent that many changes may be made to the above-described circuitry and yet still perform analog vector quantization with a switched capacitor approach. Accordingly, any equivalent circuitry may be used in place of the circuitry described herein.

Accordingly, the scope of the present invention should be determined only by the following claims, not by details recited in the specification that are not included in the claims.

What is claimed is:

1. An analog vector quantizer system for determining which of a plurality of codevectors most closely matches an input signal, the system comprising:

input means for receiving the input signal and the codevectors;

capacitor-based distortion measuring means receiving the input signal and the codevectors for determining distortions between the input signal and respective ones of the codevectors and providing respective distortion signals representative of the distortions; [and]

best match means receiving the respective distortion signals and determining which of the distortions signals represents a lowest distortion; and an identification generation circuit that produces an identification signal indicative of which codevector its associated with the lowest distortion.

2. The system of claim 1 in which the indentification signal represents an address.

3. The system of claim 1 in which the codevectors are of dimension k and the distortion measuring means comprises one distortion measuring circuit for each codevector, each of the distortion measuring circuits including k capacitor-based voltage measuring circuits.

4. The system of claim 1 in which the capacitor-based distortion measuring means computes an L1 norm.

5. The system of claim 1 used for data compression of the input signal.

6. The system of claim 1 used for pattern recognition.

7. An analog vector quantizer system for determining which of a plurality of codevectors most closely matches an input signal, the system comprising:

capacitor-based distortion measuring circuits that receive the input signal and the codevectors and that determine distortions between the input signal and respective ones of the codevectors and provide respective distortion signals representative of the distortions, the capacitor-based distortion measuring circuits including capacitors with values that are independent of the codevectors; and a best match circuit that receives the respective distortion signals and determines which of the distortion signals represents a lowest distortion.

8. The system of claim 7 in which the capacitor-based distortion measuring circuits and the best match circuit are contained in an integrated circuit and the system further comprises a codevector source that is contained in the integrated circuit.

9. The system of claim 7 in which the capacitor-based distortion measuring circuits and the best match circuit are part of an AVQ and further comprising other AVQs that determine which of the codevectors associated with them has a lowest distortion with respect to the input signal and further comprising an arbitrator logic circuit that determines which of the AVQs is associated with the lowest distortion among all the AVQs.

10. The system of claim 7 further including a sensor for sensing a physical phenomenon to create the input signal.

11. The system of claim 7 further including control circuitry for controlling the capacitor-based distortion measuring circuits and the best match circuit.

12. The system of claim 7 comprising multiple sets of the difference measuring circuits and multiple sets of the processing circuits connected to an arbitrator logic circuit, wherein each set of the difference measuring circuits and each set of processing circuits determines the best match with respect to a particular portion of the codevectors and the arbitrator logic circuit decides which best match corresponds to the lowest distortion of all.

13. The system of claim 7 in which the input signal represents image data.

14. The system of claim 7 in which the input signal represents audio signals.

15. An analog vector quantizer system for determining which of a plurality of codevectors most closely matches an input signal, the system comprising:

multiple sets of difference measuring circuits receiving the input signal and each that measure voltage differences between components of the input signal and components of respective ones of the codevectors;

multiple sets of processing circuits each including capacitors that are charged by an amount related to the voltage differences measured by a respective one of the difference measuring circuits, and are discharged to produce a distortion signal which is a measure of the distortion between the input signal and a respective one of the codevectors;

a best match circuit that receives signals reflective of the distortion signals and determines which of these signals is associated with the smallest distortion; and in which the multiple sets of the difference measuring circuits and the multiple sets of the processing circuits are connected to an arbitrator logic circuit, wherein each set of the difference measuring circuits and each set of processing circuits determines the best match with respect to a particular portion of the codevectors and the arbitrator logic circuit decides which best match corresponds to the lowest distortion of all.

16. The system of claim 15 in which the input signal represents 4×4 vectors of image data.

17. The system of claim 15 in which the input signal includes vectors having 16 components.

18. The system of claim 15 further comprising an analog mean removal vector quantization (MRVQ) circuit.

19. The system of claim 1 further comprising an analog mean removal vector quantization (MRVQ) circuit.

20. The system of claim 7 further comprising an analog mean removal vector quantization (MRVQ) circuit.

21. An analog vector quantizer system for determining which of a plurality of codevectors most closely matches an input signal, the system comprising:

capacitor-based distortion measuring circuits that receive the input signal and the codevectors and that determine distortions between the input signal and respective ones of the codevectors and provide respective distortion signals representative of the distortions;

a best match circuit that receives the respective distortion signals and determines which of the distortion signals represents a lowest distortion; and an identification generation circuit that produces an identification signal indicative of which codevector is associated with the lowest distortion.

22. An analog vector quantizer system for determining which of a plurality of codevectors most closely matches an input signal, the system comprising:

capacitor-based distortion measuring circuits that receive the input signal and the codevectors and that determine distortions between the input signal and respective ones of the codevectors and provide respective distortion signals representative of the distortions, in which the codevectors originate externally from the system; and a best match circuit that receives the respective distortion signals and determines which of the distortion signals represents a lowest distortion.

* * * * *

UNITED STATES PATENT AND TRADEMARK OFFICE
CERTIFICATE OF CORRECTION

PATENT NO. : 5,502,441
DATED : March 26, 1996
INVENTOR(S) : Swenson

It is certified that error appears in the above-indentified patent and that said Letters Patent is hereby corrected as shown below:

In the Abstract, line 3, change "Vcb" to $--\overline{Vcb}--$;

In column 4, lines 1-2, delete "in one of the distortion measuring circuits of the AVQ of";

In column 4, line 24, after "sensitivity" insert --Vs--;

In column 4, line 39, change "contain" to --containing--;

In column 6, line 16, change "(9))" to --(9)--;

In column 9, line 6, change "(3))" to --(3)--;

In column 9, line 60, at the beginning of Equation 5, change "Z" to --Q--;

In column 9, line 67, at the beginning of Equation 6, change "Z" to --Q--;

In column 10, line 16, change "(9))" to --(9)--;

In column 11, line 56, change "$\underline{\geq}$" to $--\geq--$;

In column 11, line 57, change "$\underline{\leq}$" to $--\leq--$;

In column 11, line 59, change "$\underline{\geq}$" to $--\geq--$;

In column 12, line 18, change "$\underline{\geq}$" to $--\geq--$;

In column 13, line 21, change "V151" to --V15--;

In column 13, line 62, change "17bit" to --17-bit--;

In column 14, line 11, before "258P" insert --...,--;

In column 16, line 9, after "178" change "$\mu$mil" to --mil--;

UNITED STATES PATENT AND TRADEMARK OFFICE
CERTIFICATE OF CORRECTION

PATENT NO. : 5,502,441
DATED : March 26, 1996
INVENTOR(S) : Swenson

It is certified that error appears in the above-indentified patent and that said Letters Patent is hereby corrected as shown below:

In column 22, line 35, change "m" to --$\mu$m--;

In column 23, line 61, change "cb15" to --Vcb15--;

In column 24, line 55, delete the period after "gate";

In column 27, line 24, change "4-½x" to --4½--;

In column 29, line 4, change "VSI" to --VLSI--;

In column 32, line 2, change "$\overline{V}$input" to --Vinput--;

In column 33, line 66, change "its" to --is--;

In column 33, line 61, at end of the sentence, delete "[and]"; and

In column 34, line 45, delete hyphen between "comprising" and "multiple" and insert a space therefor.

Signed and Sealed this

Thirty-first Day of December, 1996

*Attest:*

BRUCE LEHMAN

*Attesting Officer*   Commissioner of Patents and Trademarks